United States Patent [19]
Williams et al.

[11] Patent Number: 6,049,108
[45] Date of Patent: *Apr. 11, 2000

[54] TRENCH-GATED MOSFET WITH BIDIRECTIONAL VOLTAGE CLAMPING

[75] Inventors: Richard K. Williams, Cupertino; Wayne Grabowski, Los Altos; Mohamed Darwish, Campbell; Jacek Korec, San Jose, all of Calif.

[73] Assignee: Siliconix incorporated, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/920,330

[22] Filed: Aug. 28, 1997

Related U.S. Application Data

[63] Continuation-in-part of application No. 08/459,555, Jun. 2, 1995, abandoned, and a continuation-in-part of application No. 08/459,054, Jun. 2, 1995, Pat. No. 5,856,692, and a continuation-in-part of application No. 08/832,012, Apr. 2, 1997.

[51] Int. Cl.[7] .......................... H01L 27/088; H01L 29/47; H01L 29/78

[52] U.S. Cl. .......................... 257/341; 257/342; 257/331; 257/155

[58] Field of Search .................................... 257/342, 155, 257/341, 331

[56] References Cited

U.S. PATENT DOCUMENTS

| | | |
|---|---|---|
| 3,906,540 | 9/1975 | Hollins . |
| 4,823,172 | 4/1989 | Mihara ..................... 257/155 |
| 4,827,321 | 5/1989 | Baliga ..................... 257/155 |
| 4,928,155 | 5/1990 | Nakagawa et al. ............. 357/23.4 |
| 4,967,243 | 10/1990 | Baliga ..................... 257/342 |
| 5,021,840 | 6/1991 | Morris . |
| 5,072,266 | 12/1991 | Bulucea et al. ............. 357/23.4 |

(List continued on next page.)

FOREIGN PATENT DOCUMENTS

| | | |
|---|---|---|
| 0 133 642 A1 | 3/1985 | European Pat. Off. ........ H01L 27/06 |
| 0 438 700 A1 | 7/1991 | European Pat. Off. ........ H01L 29/74 |
| 0 583 022 A3 | 2/1994 | European Pat. Off. ....... H01L 21/336 |
| 0 583 028 A1 | 2/1994 | European Pat. Off. ....... H01L 29/784 |
| 0 746 029 | 12/1996 | European Pat. Off. ........ H01L 27/02 |
| 0 746 030 | 12/1996 | European Pat. Off. ........ H01L 27/02 |
| 42 08 695 A1 | 9/1992 | Germany .................... H01L 29/784 |
| 62-298152 | 12/1987 | Japan ......................... H01L 27/08 |
| 8-148699 | 6/1996 | Japan ......................... H01L 29/861 |
| 2 269 050 | 1/1994 | United Kingdom ............ H01L 29/06 |

OTHER PUBLICATIONS

Masakatsu Hoshi, et al., "A DMOSFET Having A Cell Array Field Ring for Improving Avalanche Capability", May 18, 1993, Proceedings of the International Symposium on Power Semiconductor Devices and IC's (ISPSD), Monterey, May 18–20, 1993, pp. 141–145, XP000380145.

*Primary Examiner*—Jerome Jackson, Jr.
*Attorney, Agent, or Firm*—Skjerven, Morrill, MacPherson, Franklin & Friel LLP; David E. Steuber; Carmen C. Cook

[57] ABSTRACT

The gate of a MOSFET is located in a lattice of trenches which define a plurality of cells. Most of the cells contain a MOSFET, but a selected number of the cells at predetermined locations in the lattice contain either a PN diode or a Schottky diode. The PN and Schottky diodes are connected in parallel with the channels in the MOSFET cells, with their anodes tied to the anode of the parasitic diodes in the MOSFET cells and their cathodes tied to the cathode of the parasitic diodes. When the MOSFET is biased in the normal direction (with the parasitic diode reverse-biased), the PN diodes provide a predictable breakdown voltage for the device and ensure that avalanche breakdown occurs at a location away from the trench gate where the hot carriers generated by the breakdown cannot damage the oxide layer which lines the walls of the trench. When the device is biased in the opposite direction, the Schottky diodes conduct and thereby limit charge storage at the PN junctions in the diode and MOSFET cells. This reduces the power loss in the MOSFET and improves the reverse recovery characteristics of the device when its bias is switched back to the normal direction.

14 Claims, 32 Drawing Sheets

U.S. PATENT DOCUMENTS

| | | | |
|---|---|---|---|
| 5,111,253 | 5/1992 | Korman | 257/341 |
| 5,168,331 | 12/1992 | Yilmaz | 257/331 |
| 5,191,395 | 3/1993 | Nishimura | 257/328 |
| 5,396,085 | 3/1995 | Baliga | 257/77 |
| 5,614,749 | 3/1997 | Ueno | 257/330 |
| 5,621,234 | 4/1997 | Kato | 257/339 |
| 5,689,128 | 11/1997 | Hshieh et al. | 257/331 |
| 5,696,396 | 12/1997 | Tokura et al. | 257/341 |
| 5,814,858 | 9/1998 | Williams | 257/328 |

TRENCH-GATED MOSFET WITH BIDIRECTIONAL VOLTAGE CLAMPING

REFERENCE TO PARENT AND RELATED APPLICATIONS

This application is a continuation-in-part of application Ser. No. 08/459,555, filed Jun. 2, 1995 now abandoned, a continuation-in-part of application Ser. No. 08/459,054, filed Jun. 2, 1995 now U.S. Pat. No. 5,856,692, issued Jan. 5, 1999, and a continuation-in-part of application Ser. No. 08/832,012, filed Apr. 2, 1997. This application is related to application Ser. No. 08/460,336, filed Jun. 2, 1995 now abandoned, and to application Ser. No. 08/919,523, filed on the date hereof. Each of the foregoing applications is incorporated herein by reference in its entirety.

FIELD OF THE INVENTION

This invention relates to power field-effect transistors and, in particular, to a metal-oxide-silicon field-effect transistor (MOSFET) in which the gate is positioned in a trench formed on the surface of the silicon.

BACKGROUND OF THE INVENTION

Trench-gated MOSFETs are a class of MOSFETs in which the gate is positioned in a trench that is formed at the surface and extends into the silicon. The gate is formed in lattice-like geometric pattern which defines individual cells of the MOSFET, the pattern normally taking the form of closed polygons (squares, hexagons, etc.) or a series of interdigitated stripes or rectangles. The current flows in vertical channels which are formed adjacent to the sides of the trenches. The trenches are filled with a conductive gate material, typically doped polysilicon, which is insulated from the silicon by a dielectric layer normally consisting of silicon dioxide.

Two critical characteristics of a power MOSFET are its breakdown voltage, i.e., the voltage at which it begins to conduct current when in an off condition, and its on-resistance, i.e., its resistance to current flow when in an on condition. The on-resistance of a MOSFET generally varies directly with its cell density, since when there are more cells per unit area there is also a greater total "gate width" (around the perimeter of each cell) for the current to pass through. The breakdown voltage of a MOSFET depends primarily on the doping concentrations and locations of the source, body and drain regions in each MOSFET cell.

The MOSFET is typically formed in a lightly-doped epitaxial layer of silicon which is grown on a heavily-doped silicon substrate. The gate trenches normally extend into the epitaxial layer and are frequently rectangular, with flat bottoms bounded by corners. This configuration creates a problem in that, when the MOSFET is turned off, the electric field reaches a maximum near the corners of the gate trenches. This can lead to avalanche breakdown and impact ionization near the surface of the gate oxide, with the consequent generation of carriers. If the carriers are generated within a mean free path of the interface between the silicon and the gate oxide, they may have sufficient energy to pass through the interface and become injected into the gate oxide layer. Carriers that are able to surmount the silicon/silicon dioxide energy barrier are often referred to as "hot carriers." Hot carrier injection can ultimately damage the gate oxide layer, causing changes in threshold voltage, transconductance or on-resistance, and thereby impair or destroy the MOSFET.

U.S. Pat. No. 5,072,266 to Bulucea et al. teaches a technique of suppressing voltage breakdown near the gate by the formation, in the MOSFET cell, of a deep central body diffusion that extends below the bottom of the trenches. This deep central diffusion shapes the electric field in such a way that breakdown occurs in the bulk silicon away from the gate, in a location which prevents hot carriers from reaching the gate oxide layer. A cross-sectional view of a MOSFET in accordance with U.S. Pat. No. 5,072,266 is shown in FIG. 1A, which illustrates a MOSFET cell 10 containing a trenched gate 11, an N+ source region 12, an N+ substrate (drain) 13, an N-epitaxial layer 14, and a deep central P+ diffusion 15. Note that the lowest point of P+ diffusion 15 is below the bottom of gate 11. A plan view of MOSFET cell 10 in a conventional lattice containing other similar MOSFET cells is shown in FIG. 1B. The protective deep P+ region 15 is shown at the center of each square cell, surrounded by the N+ source region 12 and the gate 11. Four complete cells are shown in FIG. 1B. The doping of deep P+ diffusion 15 is greater than the doping of P-body 16 in the region of the channel, designated by the dashed line and reference numeral 17. As a result, the distance $Y_S$ between the gate trenches must be maintained at or above a minimum value. Otherwise, the deep P+ dopant will diffuse into the channel 17 and raise the threshold voltage $V_{tn}$ of the device. The value of $Y_S$, along with the thickness of the gate, defines the cell density and helps to determine the on-resistance of the MOSFET.

To fabricate an extremely low voltage, low on-resistance power MOSFET, the dimensions of the device are generally scaled down. In particular, the cell density is increased and the epitaxial layer is made thinner, even to the point that the gate trenches may extend into the heavily-doped substrate. Such a MOSFET is illustrated as MOSFET 20 in FIG. 2A.

This creates an entirely new set of design criteria. Referring to FIG. 2A, since the corners 21C of the gate trenches 21 are surrounded by the N+ substrate 13, the electric field at these locations drops entirely across the gate oxide layer. While the formation of hot carriers in the silicon may be lower, the high electric field on the gate oxide layer may still lead to device degradation or damage. In one condition, when the gate is biased at essentially the same potential as the source and body (i.e., the device is turned off), a serious concern is that the gate oxide layer at the bottom of the trenches must support the entire voltage across the device. Compared to the embodiment of FIG. 1A, there is no epitaxial layer to absorb a portion of this voltage difference.

An equivalent circuit for MOSFET 20 is shown in FIG. 2B. Diode $D_{DB}$ represents the PN junction between N-epitaxial layer 14 and P-body region 22, and capacitor $C_{GD}$ represents the capacitor across the gate oxide layer 21A.

In the foregoing discussion it has been assumed that the MOSFET was operating in "Quadrant I", wherein (in an N-channel device) the drain is biased positive relative to the gate and the parasitic body/drain diode (represented by diode $D_{DB}$) is reverse-biased. A MOSFET can also be operated in "Quadrant III" with the source biased positive with respect to the drain and the parasitic diode forward-biased. In this condition, if the gate is turned off, diode $D_{DB}$ presents a large (typically around 700 mV) voltage drop and stores a large number of minority carriers. This slows the diode's turn off time when the MOSFET returns to Quadrant I operation.

FIG. 3 illustrates current and voltage waveforms which illustrate the basic reverse recovery problem in conventional silicon PN diodes. During interval $\Delta t_1$, the drain voltage $V_D$ is negative and the diode $D_{DB}$ is forward biased to some predetermined current density and forward voltage drop. During interval $\Delta t_2$, as $V_D$ goes positive the current through the junction of diode $D_{DB}$ decreases at a predetermined slew rate dI/dt. Eventually, in interval $\Delta t_3$ the polarity of the current in diode $D_{DB}$ reverses because its cathode has become more positive than its anode. Since the charge that was stored in diode $D_{DB}$ has not fully been removed, however, diode $D_{DB}$ continues to conduct (in a reverse direction) even though it is reverse-biased. Eventually, the stored charge will be removed (either by recombination or diffusion) and diode $D_{DB}$ will "recover", i.e. stop conducting. The term "reverse recovery" refers to this temporary operating condition wherein current is flowing in a device biased into an reverse polarity.

At the onset of interval $\Delta t_4$, magnitude of the reverse current through diode $D_{DB}$ reaches a peak and begins to decline. At the same time, the reverse voltage across diode $D_{DB}$ begins to rise sharply. The simultaneous presence of substantial voltage and conduction current in diode $D_{DB}$ leads to a power loss and undesirable heating in the diode itself. In a actual application heat generated in the diode is lost power no longer available to do work in the system, and a decrease in efficiency results. The rapid change in voltage likewise produces electrical noise which can be coupled into other parts of the circuit or system. Finally, during interval $\Delta t_5$, as a result of stray inductance the voltage across diode $D_{DB}$ overshoots the supply voltage $V_{CC}$. This can lead to oscillations, noise, further power loss or even avalanche breakdown.

It would therefore be useful to provide a MOSFET that breaks down at a well-defined voltage and at a location away from the trench when it is operating in Quadrant I and that exhibits a minimal voltage drop and charge storage characteristic when it is operating in Quadrant III.

SUMMARY OF THE INVENTION

The trench-gated MOSFET of this invention is formed in a semiconductor chip which includes a substrate alone or in combination with an overlying epitaxial layer. The gate of the MOSFET is formed in a pattern of trenches which extend downward from the surface of the chip. The MOSFET includes a source region of a first conductivity type, a body region of a second conductivity type, and a drain region of the first conductivity type, which are arranged vertically along a side wall of the trench. The gate trenches may extend into the epitaxial layer (if any), or through the epitaxial layer into the substrate.

In one group of embodiments, the MOSFET is formed as a plurality of cells which are defined by the gate trenches. The cells may be of any shape. For example, the MOSFET cells may be in the form of a square or hexagon or a series of parallel stripes or rectangles.

In accordance with this invention, in these embodiments there are created in the chip a plurality of cells which contain MOSFETs (MOSFET cells) as well as two additional types of cells which overcome the problems described above, referred to respectively as "diode cells" and "Schottky cells". The diodes cells contain a PN diode and the Schottky cells contain a Schottky diode. The PN diodes and Schottky diodes are connected in parallel with the channels in the MOSFET cells, with the anodes of the PN and Schottky diodes tied to the anodes of the parasitic diodes in the MOSFET cells and the cathodes of the PN and Schottky cells tied to the cathodes of the parasitic diodes.

Each diode cell contains a protective diffusion of the second conductivity type, which forms a PN junction with first conductivity material in the epitaxial layer or substrate. This PN junction functions as a diode. A metal layer ties the protective diffusion (i.e., one terminal of the diode) to the source regions of the MOSFET cells such that the diode is connected in parallel with the channels of the MOSFET cells.

The protective diffusion of second conductivity type operates to reduce the strength of the electric field across the gate oxide and at the corners of the trenches and limits the formation of hot carriers in the vicinity of the trench, particularly in embodiments wherein the trenches extend into the epitaxial layer. The diode operates as a voltage clamp and thereby limits the voltage across the gate oxide layer, particularly in embodiments wherein the trenches extend into the substrate and the gate oxide must support substantially the entire voltage drop across the MOSFET.

Each Schottky cell contains a Schottky diode. The Schottky diode is formed at the surface of a mesa between first and second portions of the gate trench. The mesa is doped with atoms of a first conductivity type. A gate electrode material is disposed in the trenches, which are lined with a dielectric layer to insulate the gate electrode from the mesa. A metal layer overlies a surface of the mesa, and a rectifying (or Schottky) barrier is formed at the junction between the metal layer and the surface of the mesa. The Schottky metal is tied to both a terminal of the protective diode and to the source regions of the MOSFET cells. When the Schottky diode is forward biased, a current flows vertically through the mesa.

Conventional Schottky diodes are notoriously "leaky" when they are reverse-biased. This is primarily due to the lowering of the barrier at the interface between the semiconductor material and the Schottky metal. To avoid this problem, in the Schottky cell the trenched gate is used to electrostatically shield the Schottky interface from barrier lowering. In the presence of a reverse voltage, the MOS structure pinches off (i.e. fully depletes) the regions between the trenches before the barrier lowering has a pronounced effect on leakage. The conductive material which fills the trenches in the Schottky cell may or may not be shorted to the Schottky metal.

In one embodiment, there are a selected number of diode cells (N) and a selected number Schottky cells (M) for a given number of MOSFET cells in a repetitive pattern across the MOSFET. In some embodiments M equals N. The number of diode and Schottky cells per MOSFET cells is determined by the design criteria of the MOSFET. In general, for example, MOSFETs which are expected to experience breakdown more often or more severely will require a greater proportion of diode cells.

When the MOSFET is turned on, practically all of the current flows through its channel whether the MOSFET is operating in Quadrant I or Quadrant III. When the channel is turned off and the MOSFET is operating in Quadrant I, any breakdown occurs at a voltage which is determined by the avalanche breakdown voltage of the PN diode in the diode cells. This breakdown occurs at a location that is typically near the center of the diode cells and in any event away from the gate oxide lining the trenches. The diode cells are designed such that breakdown occurs at the voltage level and location described above. The Schottky cells do not break down. Thus the diode cells in effect clamp both the MOSFET cells and the Schottky cells when the device is operating in Quadrant I.

When the channel is turned off and the MOSFET is operating in Quadrant III most of the current flows through the Schottky cells. This occurs because the voltage drop across the forward-biased Schottky diode is generally several hundred millivolts lower than the voltage necessary to create a current flow across either the PN junction in the diode cells or through the parasitic body/drain diode in the MOSFET cells. The storage of charge in the diode cells and in the MOSFET's parasitic diode is sharply reduced. Thus the Schottky cells in effect clamp both the MOSFET cells and the diode cells when the device is operating in Quadrant III.

In other embodiments a MOSFET includes a Schottky diode connected in parallel with the channel but the Schottky diode is not positioned within a "cell" of the MOSFET. Similarly, the PN diode need not be formed within a cell.

The invention also comprises various techniques for controlling the breakdown voltage of the diode cell. In one embodiment, a breakdown voltage control region having a dopant concentration of the first conductivity type greater than the background dopant concentration of the epitaxial layer is formed in the diode cell. The region is preferably located at center of the diode cell and can be formed by implanting dopant through the top surface of the epitaxial layer or by updiffusing dopant from the interface between the epitaxial layer and the substrate.

Another technique for controlling the breakdown voltage of the diode cell involves providing a curved segment in the PN junction between the protective diffusion of the second conductivity type and the epitaxial layer and establishing a selected radius of curvature the curved segment so as to control the breakdown voltage of the diode cell. In general, reducing the radius of curvature of the curved segment reduces the breakdown voltage. Moreover, the distance which separates the protective diffusion from the substrate also can be used to determine the breakdown voltage of the diode cell, since the protective diffusion, the substrate and the intervening portion of the epitaxial layer form a PIN diode whose breakdown is primarily a function of the width and dopant concentration of the intervening portion of the epitaxial layer.

In additional embodiments a zener diode is formed in the diode cell, preferably by continuing into the diode cell the diffusions that are used to form the source and body in the MOSFET cell. In one group of embodiments a zener diode is formed near the surface of the epitaxial layer; in another group of embodiments a buried zener diode is formed in the diode cell.

DESCRIPTION OF THE INVENTION

Figure 4:
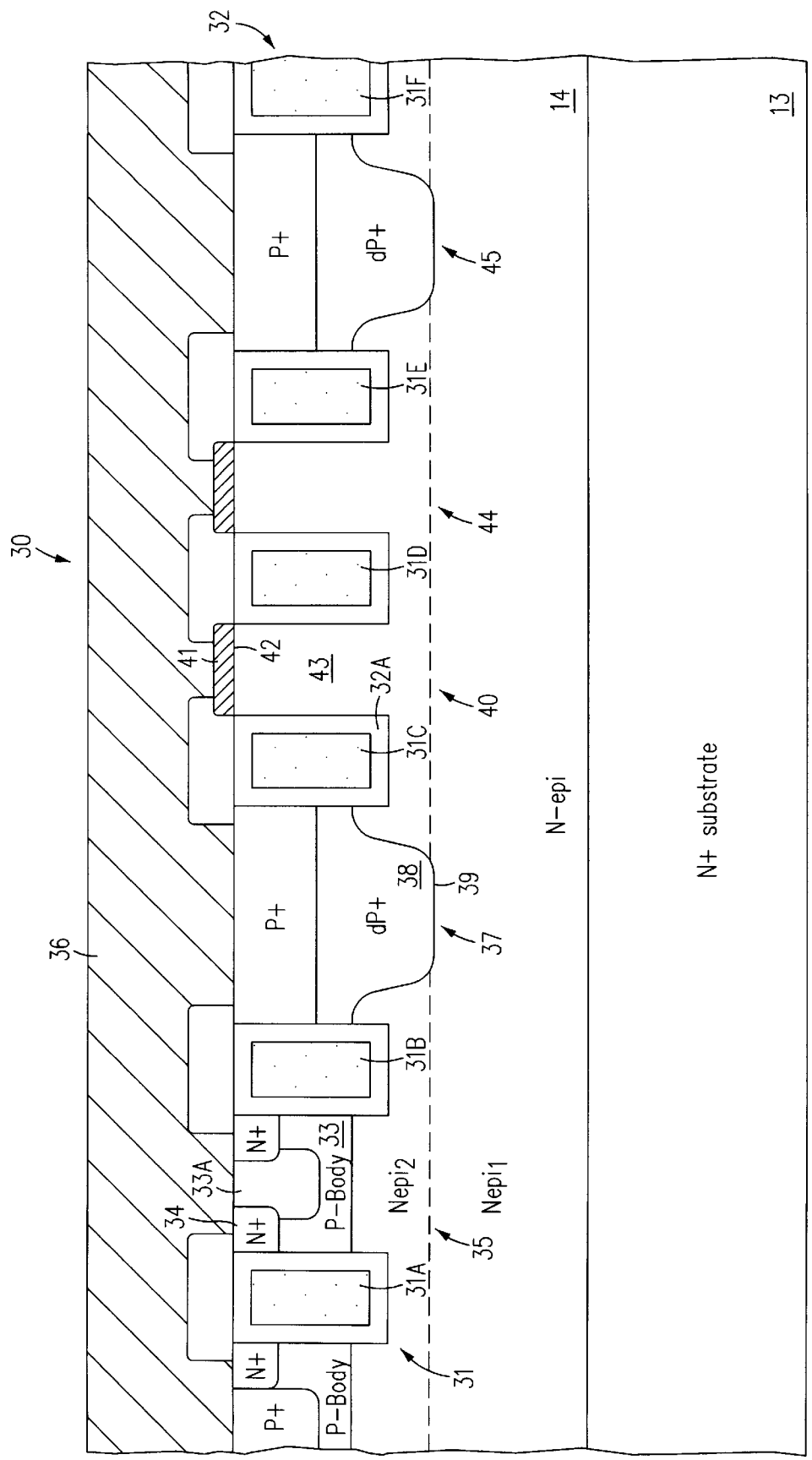
FIG. 4 illustrates a cross-sectional view of a first embodiment of this invention including an N-channel MOSFET cell, a diode cell and a Schottky cell.

FIG. 4 shows a cross-sectional view of a trench-gated MOSFET 30 in accordance with this invention. MOSFET 30 is formed in N-epitaxial layer 14, which is grown on the top surface of N+ substrate 13. N-epitaxial layer 14 includes two sublayers: a layer $Nepi_1$ and a layer $Nepi_2$, with $Nepi_1$ being doped more heavily than $Nepi_2$. A gate 31, including segments 31A, 31B, 31C, 31D, 31E and 31F, is formed in a trench 32. Gate 31 is separated from the semiconductor material by an oxide layer 32A. A MOSFET cell 35 of MOSFET 30, located between gate segments 31A and 31B, includes a P-body region 33, a shallow P+ contact region 33A, and an N+ source region 34. A metal layer 36 makes contact with and forms a short between P-body region 33 and N+ source region 34.

N+ substrate 13 serves as the drain of MOSFET 30 and may be contacted from the bottom. Alternatively, a submerged N+ layer instead of the N+ substrate could be used as the drain, and the drain could be contacted from the top side of the structure by means of, for example, an N+ sinker region and a top side contact.

In a neighboring cell 37, between gate segments 31B and 31C, a protective deep P+ diffusion 38 is formed. Diffusion 38 forms a PN junction 39 with N-epitaxial layer 14. Metal layer 36 forms an ohmic contact with protective diffusion 38, and thus PN junction 39 represents a diode which is connected in parallel with the channel of cell 35. The ohmic contact to the p+ diffusion 38 need not be truly ohmic since the surface concentration of the diffusion 38 is sufficiently high that quantum mechanical "tunneling" conduction will occur even if the respective work functions of the metal and silicon result in an energy barrier.

MOSFET 30 also includes a Schottky cell 40, which is located between gate segments 31C and 31D. Schottky cell 40 includes a Schottky metal layer 41 (e.g., titanium or titanium silicide) which forms a rectifying interface 42 with N-epitaxial layer 14. Interface 42 is at the top surface of a mesa 43.

MOSFET 30 also includes a Schottky cell 44 similar to Schottky cell 40 and a diode cell 45 similar to diode cell 37.

Figure 1A:
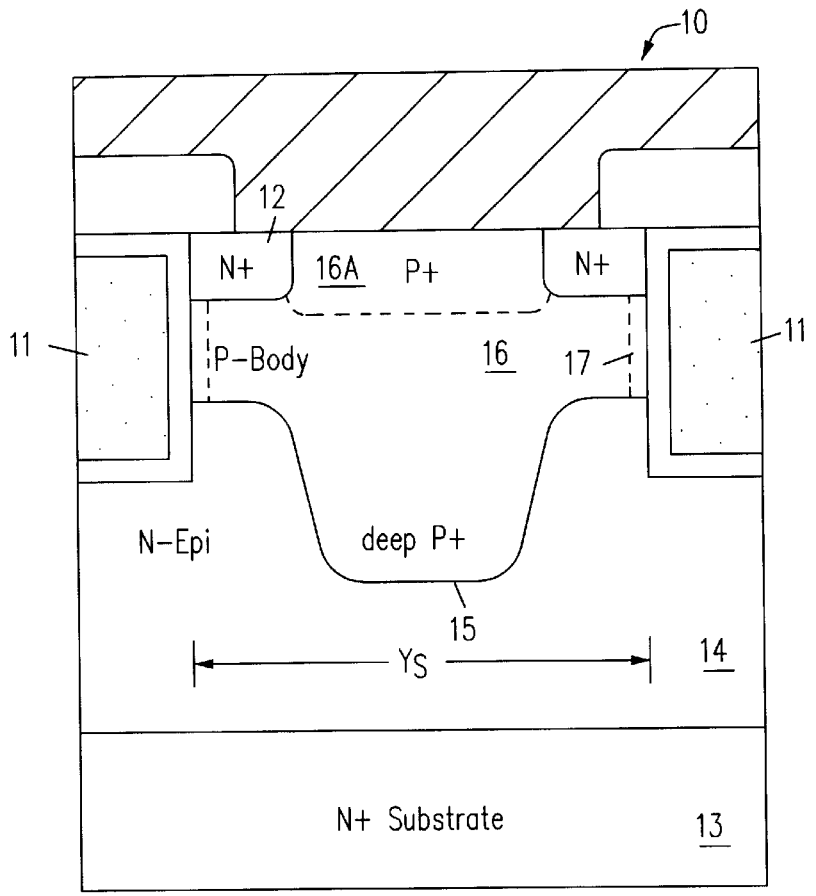
FIG. 1A illustrates a cross-sectional view of a conventional trench-gated MOSFET containing a deep central diffusion to reduce the electric field at the corners of the trenches.
Figure 1B:
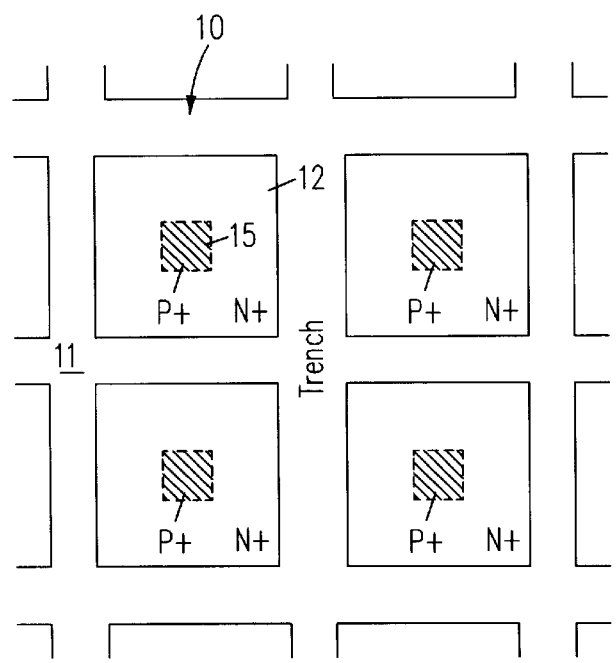
FIG. 1B illustrates a top view of the MOSFET cell of FIG. 1A in a lattice containing other similar MOSFET cells.

Referring first to diode cell 37, protective diffusion 38 limits the maximum voltage and therefore the strength of the electric field and resulting carrier formation near the corners of trench 32, and thereby eliminates the need for a deep central diffusion in MOSFET cell 35. With no deep central P+ diffusion, the dimensions of MOSFET cell 35 may be substantially reduced and the cell density of MOSFET 30 may be significantly increased. For example, the width of each side of N+ source region 34 may be reduced to about 1.0 $\mu$m, and the width of the contact between metal layer 36 and the P+ contact region for P-body 33 may be reduced to about 1.0 $\mu$m, so that the total width between trenches 32 may be on the order of 3.5 $\mu$m, although in practice the total width between trenches 32 might be set at 5.0 $\mu$m. This compares with a minimum width of about 8.0 $\mu$m for a MOSFET cell which contains a deep central diffusion (see FIG. 1A).

As described below, the dopant concentration in the sublayer $Nepi_1$ is set to optimize the breakdown voltage of diode D2, which is determined by the dopant concentrations on either side of the PN junction 39. The dopant concentration of $Nepi_1$ is typically higher than the dopant concentration of $Nepi_2$, thus helping to assure that diode D2 breaks down before diode D1, which is formed at the junction of the P-body 33 and the sublayer $Nepi_2$ in MOSFET cell 35.

Referring to the Schottky cell 40, the gate segments 31C and 31D surround the Schottky interface 42 at a well defined pitch to guarantee full depletion of the silicon in mesa 43 at high reverse biases. A major disadvantage of conventional Schottky diodes is their relatively high offstate leakage current, which is typically orders of magnitude higher than the leakage current of a PN junction diode. Moreover, the leakage current in a Schottky diode is strongly dependent on voltage, as a consequence of reverse-voltage-induced barrier-lowering at the rectifying metal-semiconductor interface (sometimes referred to as the "Schottky interface"). Unfortunately, using a different Schottky barrier metal to adjust the barrier height and thereby reduce current leakage increases the on-state forward voltage drop across the diode, resulting in a difficult tradeoff between on-state and off-state characteristics. The well known equation $$J_f = AT^2 e^{\frac{-q\phi_b}{kT}} \left[ e^{\frac{qV_f}{kT}} - 1 \right]$$

$$J_f = AT^2 e^{\frac{-q\phi_b}{kT}}$$

where the work function as given by $$\Delta\phi_b = \left( \frac{3qN_D(V_{bi} + V_r)}{8\pi^2 \varepsilon_S^3} \right)^{1/4}$$

highlights the tradeoff since the work function is a function of the reverse-voltage Vr. In this equation, q is the charge of an electron ($1 \times 10^{-19}$ coulombs), $N_D$ is the net doping, $V_{bi}$ is the built-in potential of the metal/semiconductor interface, $V_r$ is the applied reverse bias, $\epsilon_S$ is the permittivity of the semiconductor.

In Schottky cell 40 gate segments 31C and 31D along with the gate oxide layer 32A form facing MOS capacitors, and pinch-off (i.e. the full depletion) of the mesa 43 between the facing MOS capacitors electrostatically shields the Schottky interface from the barrier lowering effect. The MOS sandwich is like a vertical channel version of a dual gate JFET (except that an MOS capacitor forms the depletion region rather than a reverse biased PN junction) or a fully depleted SOI MOSFET.

The three types of diodes-namely, the P-body to N-epi PN junction, the deep P+ to N-epi avalanche clamping diode, and the metal to N-epi Schottky diode-are in parallel, meaning that all three share the N-epi as a common cathode.

Despite their dissimilar anode materials the aluminum metal shorts their anodes (albeit with some resistance). As parallel diodes, all three are forward biased whenever the anode is more positive than the drain (cathode) and reverse-biased whenever the anode is more negative than the drain. Since an N-channel MOSFET is (normally) operated with its N+ drain more positive than its P-type body (i.e. reverse biased), the direction of diode conduction is opposite that used for MOSFET operation. In other words the parallel combination of diodes are "antiparallel" to the MOSFET. Therefore all three diodes are normally reverse-biased together in Quadrant I and are all forward biased together in Quadrant III. Since the diodes are in parallel, the lowest voltage diode always conducts the majority of the current, as long as the MOSFET is off. In Quadrant I the lowest breakdown diode should carry the current. In Quadrant III the lowest forward voltage diode should carry the current.

Schottky metal layer 41 is in contact with metal 36. Consequently, the Schottky diode in Schottky cell 40 is connected in parallel with both the PN diode represented by interface 39 in diode cell 37 and the parasitic diode represented by the interface between P-body region 33 and N-epitaxial layer 14 in MOSFET cell 35.

Figure 5:
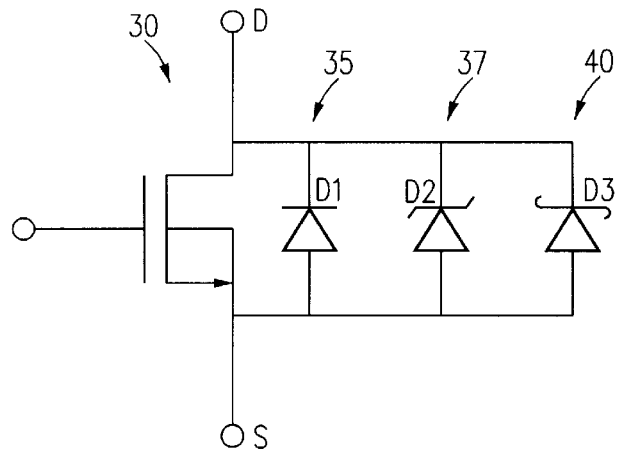
FIG. 5 illustrates an equivalent circuit of the embodiment shown in FIG. 4.

FIG. 5 is an equivalent circuit diagram of MOSFET 30. Diode D1 represents the parasitic diode within MOSFET cell 35, diode D2 represents the PN diode in diode cell 37, and diode D3 represents the Schottky diode in Schottky cell 40.

Figure 6A:
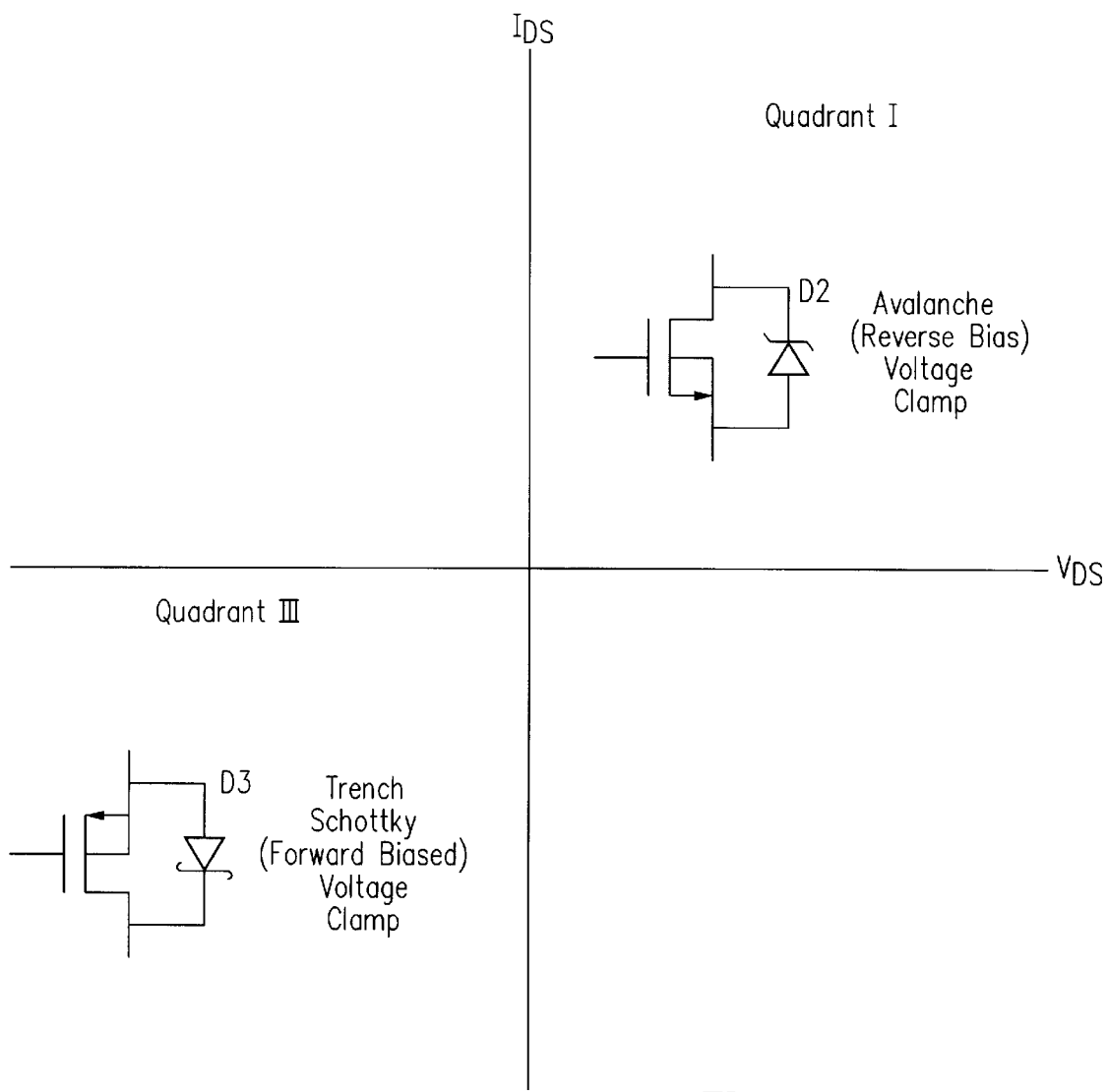
FIG. 6A illustrates a graph showing the operation of the diode cell and Schottky cell.

FIG. 6A shows on a current vs. voltage graph the regions in which diodes D2 and D3 are operative. The vertical axis is $I_{DS}$, the current flowing between the drain and source terminals of MOSFET 30, and the horizontal axis is $V_{DS}$, the voltage across the drain and source terminals. In Quadrant I, where both IDS and $V_{DS}$ are positive, diode D2 is operative. Diodes D1, D2 and D3 are reverse-biased and diode D2 breaks down at a predictable level and at a location in diode cell 37 away from the gate oxide layer, thereby protecting MOSFET 30 from the damaging effects of hot carrier injection into the gate oxide. Diode D2 is designed to break down at a positive voltage $V_{DS}$ which is lower than the breakdown voltage of either diode D1 or diode D3. In Quadrant III, where both $I_{DS}$ and $V_{DS}$ are negative, Schottky diode D3 is operative. Diodes D1, D2 and D3 are forward-biased, and Schottky diode D3 conducts most of the current since its forward voltage drop is substantially (e.g., several hundred millivolts) lower than the forward voltage drops of either diode D1 or diode D2, both of which are PN diodes. Since diodes D1 and D2 carry very little current, there is very little charge storage near the PN junctions of these diodes. Thus when $V_{DS}$ returns to Quadrant I the reverse recovery problem described above is greatly alleviated.

The above conditions apply when MOSFET 30 is turned off, i.e., the gate is biased below threshold voltage. When MOSFET 30 is turned on, practically all of the current flows through its channel, and the level of $I_{DS}$ is determined by the on-resistance of MOSFET 30, along with the impedance of other elements of the circuit into which MOSFET 30 is connected.

Figure 6B:
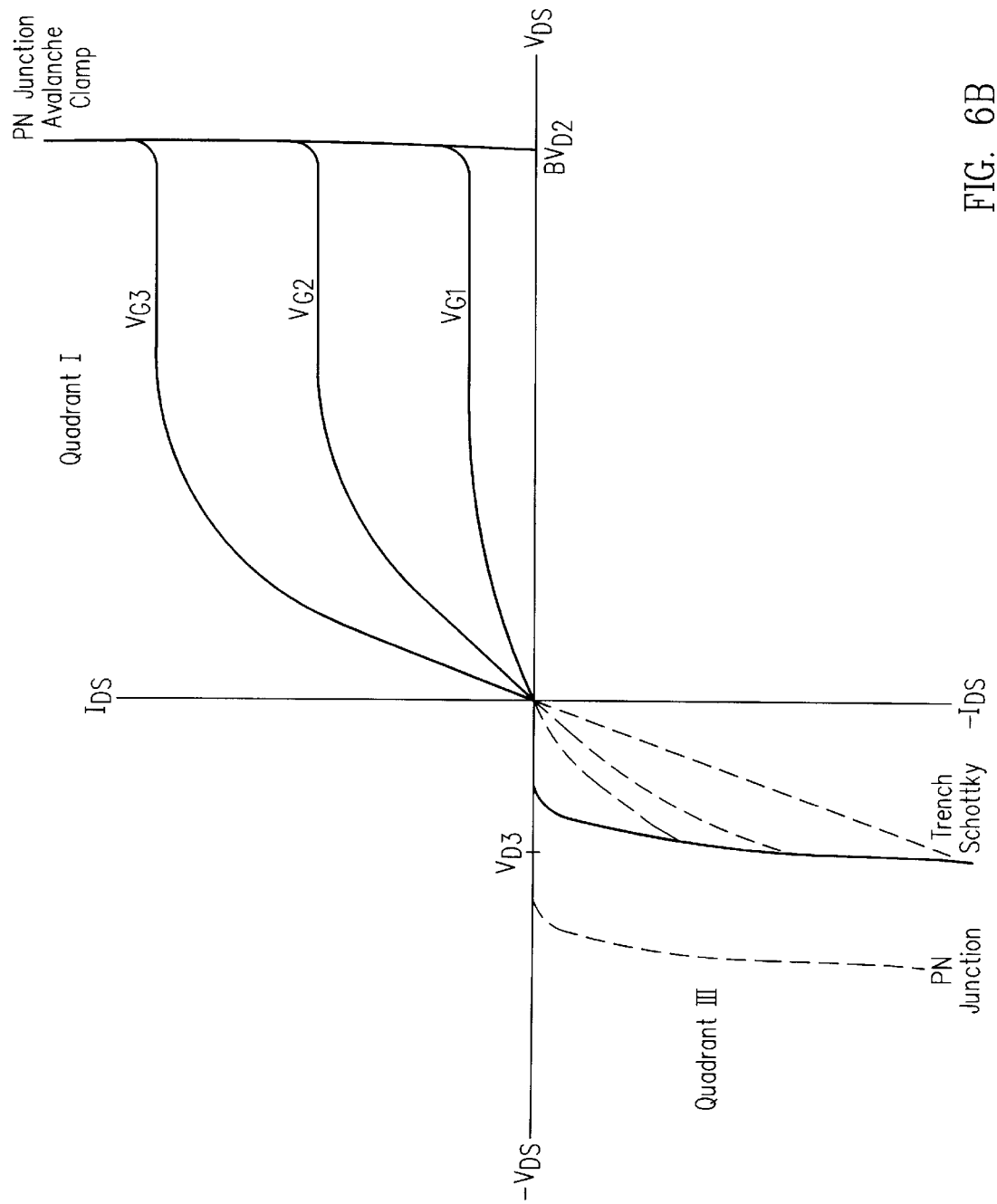
FIG. 6B illustrates a graph showing the current/voltage characteristics of the diode and Schottky cells, respectively.

FIG. 6B shows a graph of $I_{DS}$ vs. $V_{DS}$ at gate voltages $V_{G1}$, $V_{G2}$ and $V_{G3}$. In all cases the MOSFET is clamped in Quadrant I at $BV_{D2}$, the breakdown voltage of diode D2. In Quadrant III the MOSFET is clamped at $V_{D3}$, the forward voltage drop across diode D3.

Figure 7:
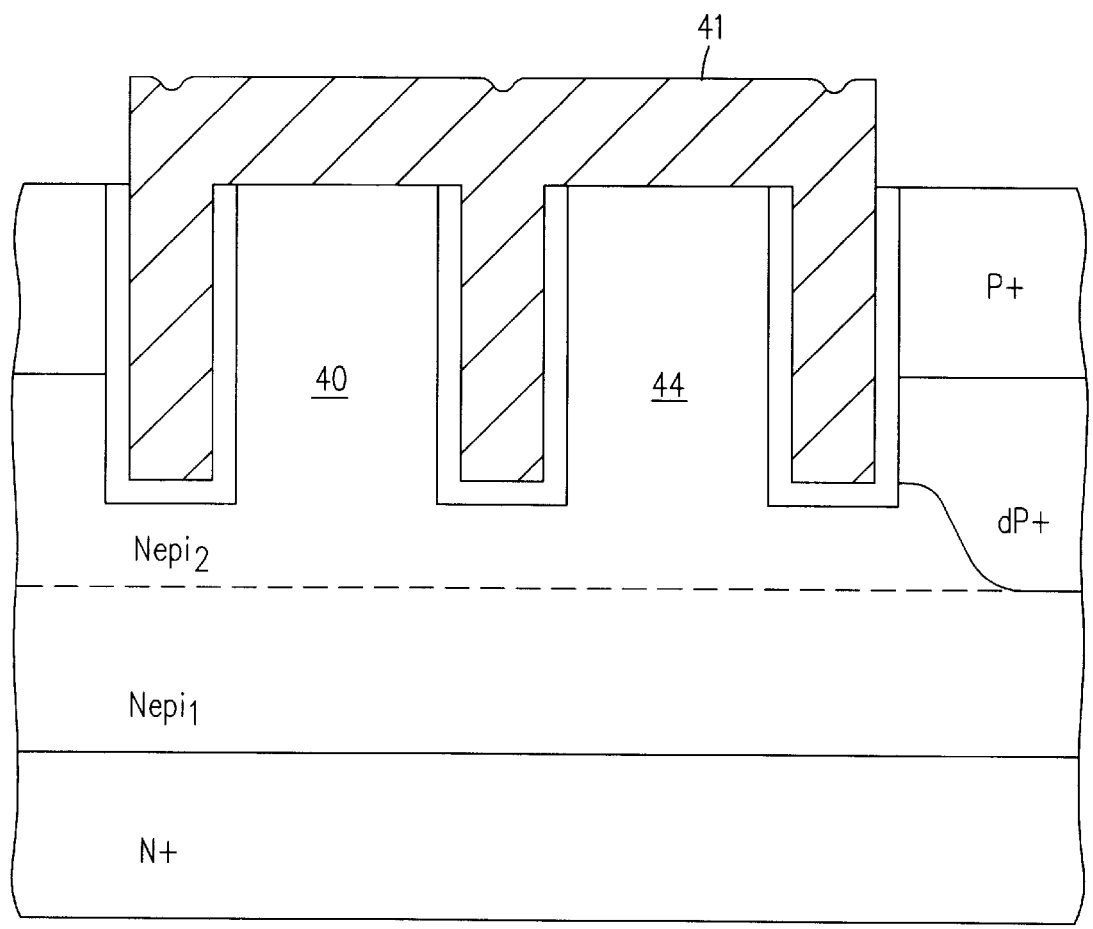
FIG. 7 illustrates a cross-sectional view of an alternative embodiment of a Schottky cell.

MOSFET 30 is shown in FIG. 4 with the gate segments 31C, 31D and 31E not being directly connected to the Schottky metal 41 or the metal layer 36. It should be understood, however, that when MOSFET 30 is turned off its source and gate terminals are typically shorted together and thus the gate segments 31C, 31D and 31E are at the same potential as the Schottky metal 41 and the metal layer 36. Alternatively, then, Schottky cell 40 can be fabricated as shown in FIG. 7, with the Schottky metal 41 filling the gate trenches and with metal layer 36 (not shown) contacting Schottky metal 41. As another alternative, the gate polysilicon in any Schottky portion of the device (if located in a common region) can be shorted to the Schottky anode or the MOSFET source, while the MOSFET gate still connects to a bonding pad. If the Schottky diodes are distributed throughout the MOSFET cells uniformly (as the avalanche clamping diodes are) then it may be difficult to contact their gates uniquely and their gates are best tied to the gate pad.

Figure 8:
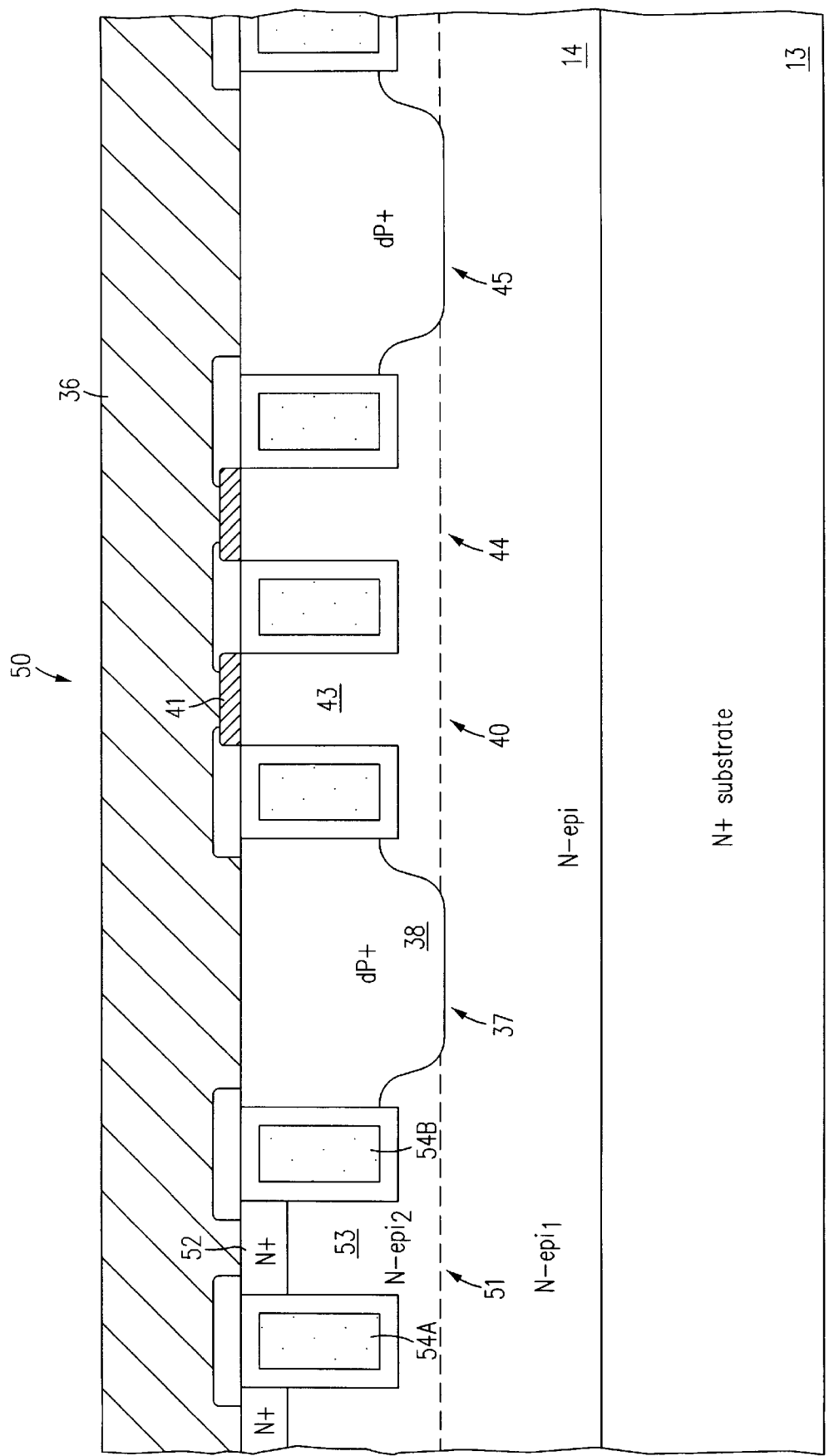
FIG. 8 illustrates a cross-sectional view of an alternative embodiment of a MOSFET containing an accumulation mode MOSFET (ACCUFET).

FIG. 8 shows a cross-sectional view of an accumulation mode field-effect transistor 50 which contains a FET cell 51. Accumulation mode FETs, sometimes referred to as "ACCUFETs", are trench-type MOSFETs which contain no body region and hence no PN junctions. The mesa 53 between the trenched gate segments 54A and 54B is made relatively narrow (e.g., 0.5 to 4.0 μm wide), and the gate material (typically polysilicon) is doped in such a way that it has a work function which depletes the entire mesa region, much like a junction field-effect-transistor (JFET). The proximity of the gate electrically induces an energy barrier to suppress off-state conduction. The current path extends between a N+ "source" 52 at the top of the mesa 53 and the N+ substrate which functions as a "drain".

ACCUFET cell 51 is turned off when the gate voltage is equal to the source voltage (i.e., $V_{GS}$=0). If $V_{GS}$ is increased, the depletion regions surrounding the gate segments 54A and 54B contract and open a current path between the N+ source 52 and the substrate 13. With further increasing $V_{GS}$ the depletion regions continue to contract until eventually accumulation regions are formed adjacent the trenches, enhancing channel conduction and further lowering the on-resistance of the device. The operation of ACCUFET cell 51 is further described in the above-referenced parent application Ser. No. 08/459,054, as well as in U.S. Pat. No. 4,903,189 to Ngo et al.; B. J. Baliga et al., "The Accumulation-Mode Field-Effect Transistor: A New Ultralow On-Resistance MOSFET", IEEE Electron Device Letters, Vol. 13, No. 8, August 1992, pp. 427–429; and T. Syau et al., "Comparison of Ultralow Specific On-Resistance UMOSFET Structures: The ACCUFET, EXTFET, INVFET, and Conventional UMOSFET's", IEEE Electron Device Letters, Vol. 41, No. 5, May 1994, pp. 800–808.

One of the principal problems with ACCUFETs has been their inability to withstand high voltages when they are in an off condition. In this condition, practically the entire voltage drop across the device is taken up in the space between the bottom of the gate 54A, 54B and the N+ substrate 13 (i.e., within the gate oxide layer and the limited thickness of epitaxial layer 14 beneath the trench). Unless this voltage is limited in some way, it may rupture the gate oxide layer. When the gate oxide layer has been ruptured, the device is generally destroyed beyond repair.

The PN diodes within diode cells 37 and 45 are designed to break down before the voltage across ACCUFET 50 reaches a level which would rupture the gate oxide layer. Schottky cells 40 and 44 provide a voltage clamping function when the source voltage is greater than the drain voltage and thereby limit the storage of charge at the PN junctions in diode cells 37 and 45.

Figure 9:
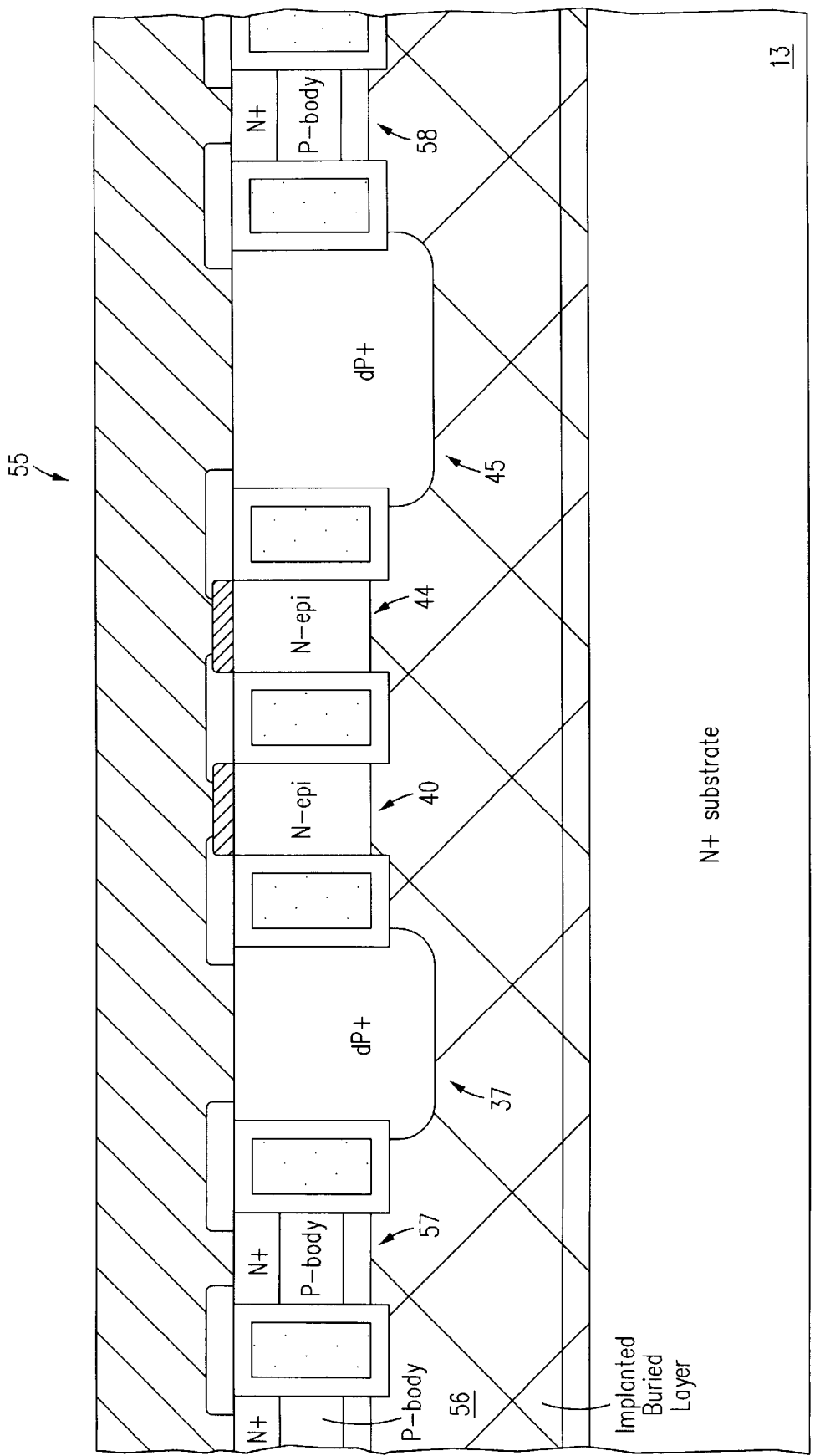
FIG. 9 illustrates a cross-sectional view of an alternative embodiment containing a narrow or fully depleted trench MOSFET in which the trenches extend into a heavily doped buried layer.

To obtain the lowest on-state voltage drop across an ACCUFET or across a trench-gated Schottky diode, the trenches should extend into the heavily-doped substrate or an updiffusion therefrom. Growing a gate oxide in such a degenerately doped material (with a resistivity typically in the range of 2mΩ-cm) suffers from the formation of weak spots in the gate oxide arising from thin or improper atomic arrangements in the oxide where it is thermally grown over the crystalline defects in the degenerately doped material. By forming via ion implantation a heavily-doped buried layer that extends into the substrate and into which the trenches extend a low resistance path is established without resulting in oxide defects of the kind referred to above. Such an embodiment is shown in FIG. 9, where MOSFET 55 contains an N+ buried layer 56 which overlaps the N+ substrate 13. MOSFET 55 contains MOSFET cells 57 and 58, as well as diode cells 37 and 45 and Schottky cells 40 and 44 which function in the manner of the similarly numbered cells of FIG. 8.

Figure 10A:
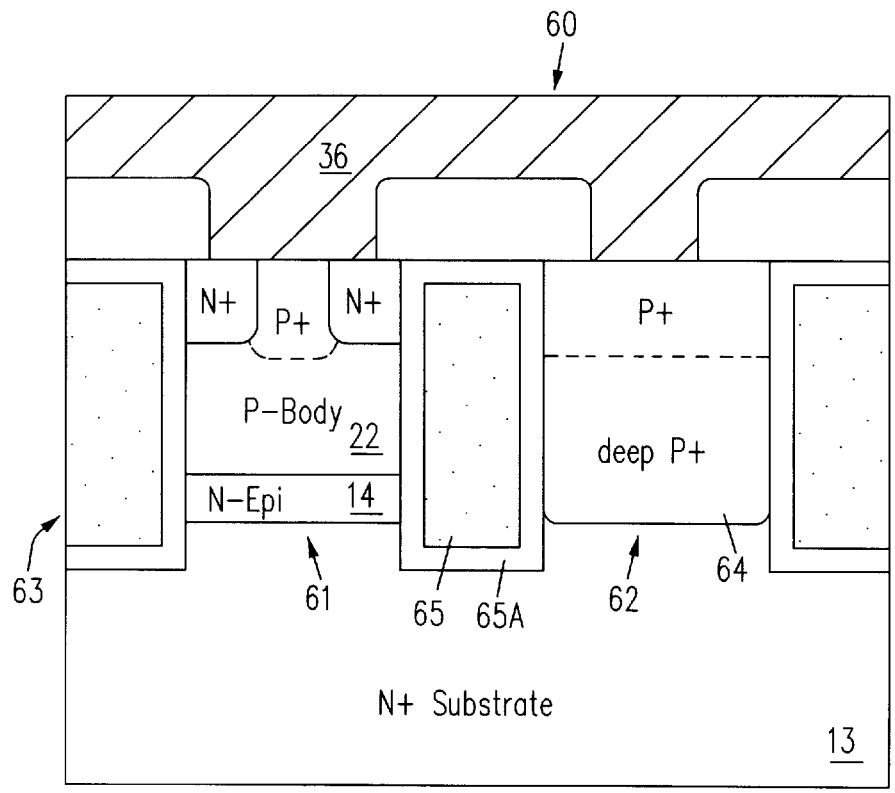
FIG. 10A illustrates a cross-sectional view of an alternative embodiment in which the trenches extend into the substrate.

FIG. 10A illustrates an alternative form of MOSFET cell that can be used in embodiments of this invention. MOSFET 60 which includes a MOSFET cell 61 that is similar to the cell shown in FIG. 2A. That is, trenches 63 extend through the N-epitaxial layer 14 and into the N+ substrate 13, and cell 61 does not include a central deep P+ diffusion. In an adjacent cell 62, a protective P+ diffusion 64 is formed, with the lower junction of diffusion 64 reaching the top surface of N+ substrate 13.

Figure 10B:
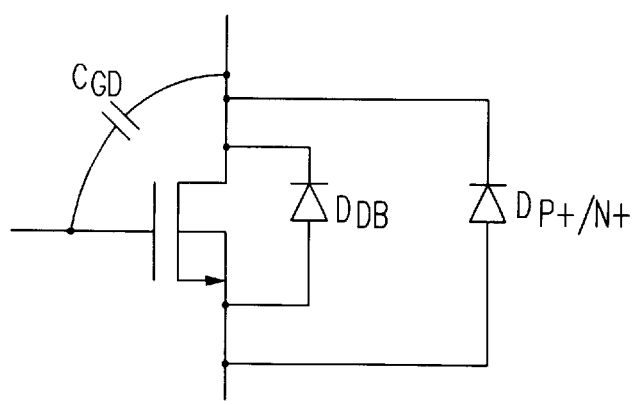
FIG. 10B illustrates an equivalent circuit for the embodiment of FIG. 10A.

FIG. 10B illustrates an equivalent circuit for MOSFET 60. Since the corners of trench 63 are located in the N+ substrate 13, which being heavily-doped cannot support a strong electric field, the problem of the electric field at the corners of the trenches is largely eliminated. Instead, the critical factor becomes the strength of the electric field between the gate 65 and the N+ substrate 13, i.e., across the gate oxide layer 65A. This location is represented by a capacitor $C_{GD}$ in FIG. 10B. The PN junction between P-body region 22 and N-epitaxial layer 14 is represented by a diode $D_{DB}$, and the PN junction between P+ diffusion 64 and N+ substrate 13 is represented by a diode $D_{P+/N+}$. As shown, both diode $D_{DB}$ and diode $D_{P+/N+}$ are connected in parallel with the channel of MOSFET cell 61.

Figure 11:
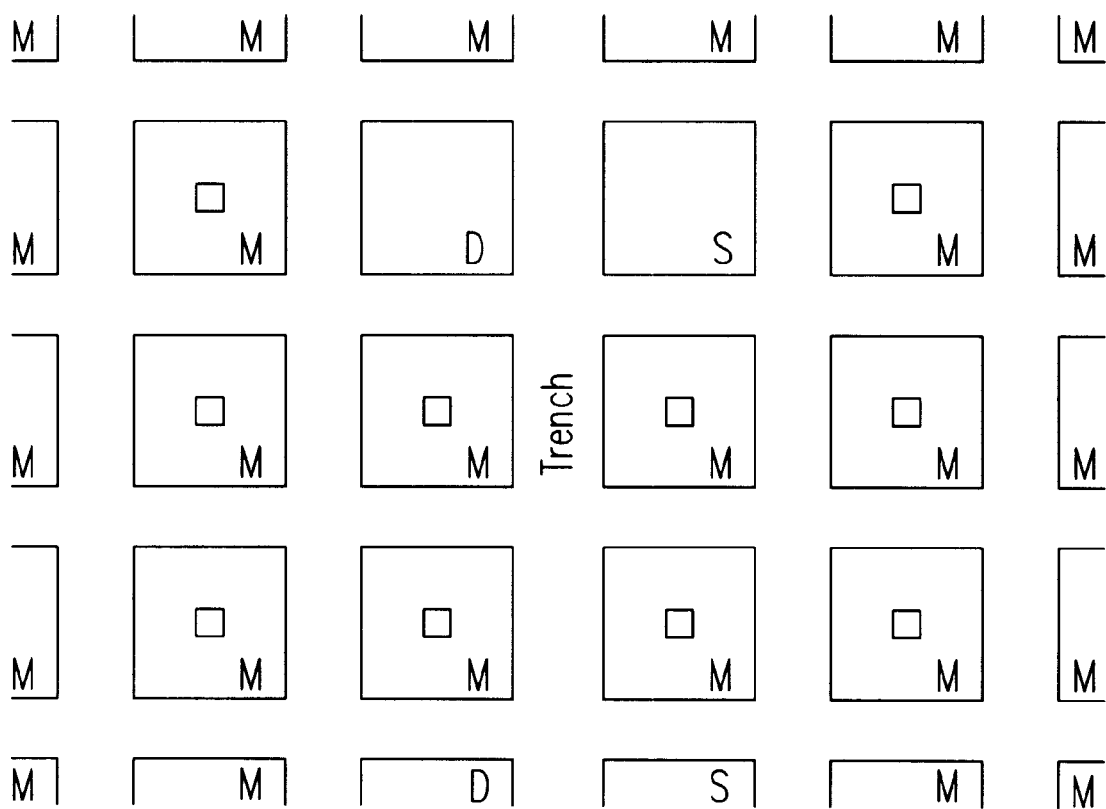
FIG. 11 illustrates a top view of a square-cell MOSFET in accordance with this invention.

FIG. 11 shows a top view of a MOSFET in accordance with this invention. The MOSFET cells are labeled "M", the diode cells are labeled "D", and the Schottky cells are labeled "S". Note that FIG. 11 is not drawn to scale. In actual embodiments the dimensions of the different types of cells-including squares, rectangles, hexagonals or stripes, among others (even circles or triangles are possible although not area efficient)-may vary in a single device. Similarly, in FIG. 11 there is one diode cell and one Schottky cell for every ten MOSFET cells (total of twelve cells), but these ratios can vary according to the particular demands of the device.

Figure 12:
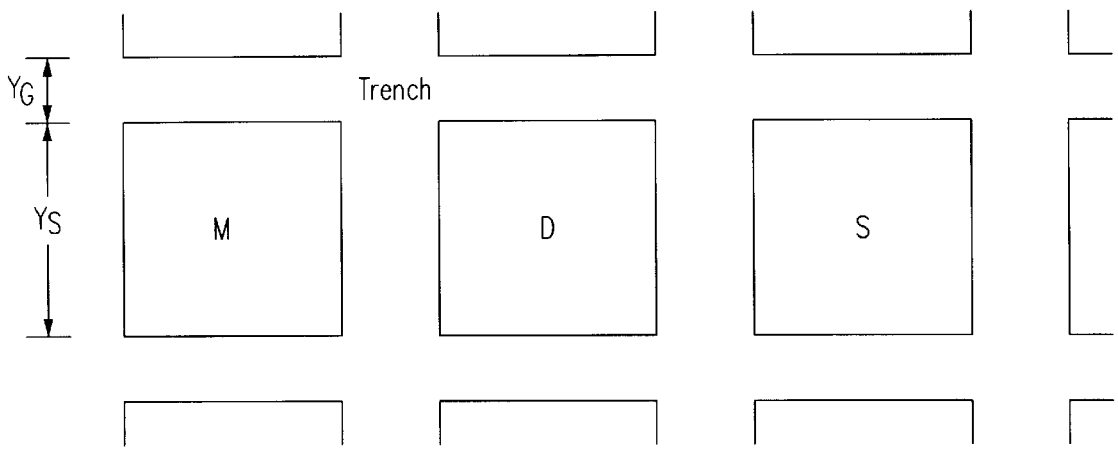
FIG. 12 illustrates an expanded view of a portion of FIG. 11.

FIG. 12 shows a top view of three of the cells shown in FIG. 11 (one MOSFET cell, one diode cell, and one Schottky cell). $Y_S$ represents the distance between the trenched gates and $Y_G$ represents the cross-sectional width of the trench (not to be confused with the gate width W around the perimeter of the cell). It is assumed in this example that the dimensions of the cells are the same. The following equation gives the total area A of n total cells (including MOSFET, diode and Schottky cells):

$$A = n \ (Y_G + Y_S)^2$$

Assuming that there is one diode cell and one Schottky cell for every n total cells, there are n−2 MOSFET cells. The total gate width W in the n cells is equal to:

$$W = 4 \ Y_S \ (n-2)$$

Accordingly, the area-to-width ratio A/W (a figure of merit indicating how effectively a gate width W is packed into an area A) equals:

$$\frac{A}{W} = \frac{(Y_G + Y_S)^2}{4 Y_S} \cdot \frac{n}{n-2}$$

or, more generically, if every n total cells has one diode cell and m Schottky cells then the MOSFET perimeter figure of merit equals $$\frac{A}{W} = \frac{(Y_G + Y_S)^2}{4 Y_S} \cdot \frac{n}{n-(1+m)}$$

Thus the ratio A/W for a MOSFET which contains diode and Schottky cells is increased by the factor n/(n−2) for m=1, as compared with a conventional MOSFET. This "penalty" factor, which arises from the fact that the diode and Schottky cells carry no MOSFET channel current, decreases approaching unity as n increases. The penalty is counterbalanced by the increased total gate width (and hence current-carrying capacity) which is obtained by increasing the cell density of the device. Generally, n is determined by the frequency or intensity with which the MOSFET is expected to break down. Devices which are expected to break down more frequently or carry high avalanche current densities will generally require a lower n, i.e., there must be a greater number of clamping diode cells relative to the total number of cells. In the extreme case where two of every three cells are inactive (i.e., diode or Schottky) cells, n=3 and n/n−2=3, the efficiency benefits of this structure are somewhat limited. On the other hand, if only two of every 21 cells is a diode or Schottky cell, for example, n=21 and n/n−2=21/19, representing virtually no penalty for the inactive cells.

In conclusion, the regularly distributed inclusion of non-active deep P+ and trench-gated Schottky cells in a vertical trench FET provides a voltage clamping feature which limits the carrier generation rate and electric field at the corners or in the vicinity of the trench gate. The reliability and survivability of the device in the presence of electrical overstressing is thereby improved without limiting on-resistance or cell density. When the device is operated in Quadrant III, the forward voltage drop across the device is lowered, reducing power dissipation and the quantity of stored charge at the PN junctions in the diode and MOSFET cells. As a result, the peak reverse recovery currents and reverse recovery times are decreased, resulting in reduced energy losses when the device transits from Quadrant III to Quadrant I operation. As previously described, as the number of clamping diode cells is increased the avalanche current handling capability of the device is adjusted. In a similar manner, increasing the number of Schottky diode cells increases the current handling capability of the Schottky diode and decreases its resistance.

The current density of the Schottky diodes is given by their current divided by the total area of the Schottky cells, i.e.:

$$J = \frac{I_{quadrant\ III}}{m(Y_S)^2} \approx 100 - 200 \frac{A}{cm^2}$$

which should be in the range of several hundred amperes per cm². In many inductive load applications the current in quadrant III (Schottky) must instantaneously equal the MOSFET current in quadrant I at the instant of switching, i.e., $I_{quadrantIII} = I_{quadrant\ I}$.

The deep P+ region need not extend to the trench edge but may be made smaller than its cell geometry if desired. Likewise, the deep P+ region need not extend below the trench if the trench overlaps the N+ substrate, in which case a PIN diode may be formed between the deep P+ region and the N+ substrate (see FIG. 16). A graph showing the breakdown voltage of a PIN diode (such as diode D2 in FIG. 16) as a function of the doping concentration and width of the intermediate or "intrinsic" region is provided in S. M. Sze, *Physics of Semiconductor Devices*, Second Edition, John Wiley & Sons (1981), p. 105, FIG. 32, which is incorporated herein by reference.

Figure 13:
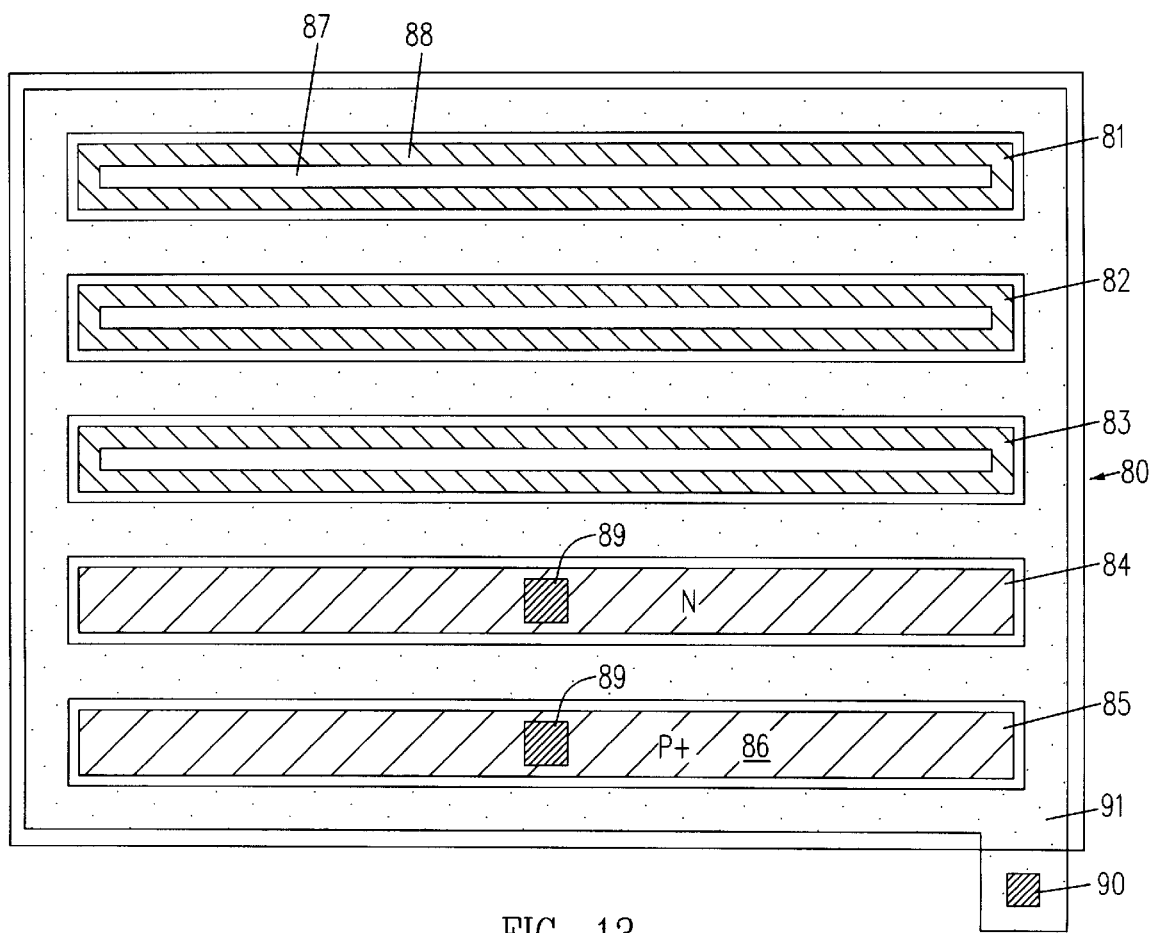
FIG. 13 illustrates a top view of a striped-cell MOSFET in accordance with this invention.

FIG. 13 illustrates a top view of an alternative MOSFET in which the cells are in the form of stripes. In MOSFET 80, cells 81, 82, and 83 are active MOSFET cells, cell 84 is a Schottky cell and cell 85 is a diode cell. Each of cells 81–83 contains a P+ contact region 87 and an N+ source region 88. Contact holes 89, two of which are shown in FIG. 13, are used to provide contact between a metal layer (not shown) and P+ region 87 and N+ source region 88 in MOSFET cells 81–83, an N-epi region in Schottky cell 84, and P+ region 86 in diode cell 85. Contact holes 89 may be arranged in a variety of patterns over cells 81–85 but are generally repeated for maximum contact area. Alternatively, the contact may be in the form of a continuous stripe. A contact hole 90 for making contact with gate 91 is also shown. Again FIG. 13 is not drawn to scale.

Another use of the P+ diode cell is to clamp the drain voltage so as to protect the gate oxide layer from overstress due to excessive electric fields between the gate and the N+ substrate. This situation arises particularly in embodiments where the trench gate extends into the substrate and the gate oxide layer at the bottom of the trench is therefore exposed to the entire voltage difference between the gate and substrate. Silicon dioxide is capable of withstanding a voltage equal to about 8 MV/cm. Using a safety factor of 50%, the industry generally considers the maximum voltage that may be applied across a gate oxide layer to be $X_{OX}$·4MV/cm, $X_{OX}$ being the thickness of the gate oxide in centimeters. Accordingly, the breakdown voltage of the diode that is formed by the protective P+ diffusion should be no greater than $X_{OX}$·4MV/cm. For example, with an oxide layer having a thickness of 400Å, the oxide layer will rupture at about 32 V, and for reliable operation the maximum voltage should be limited to 16 V.

Figure 14:
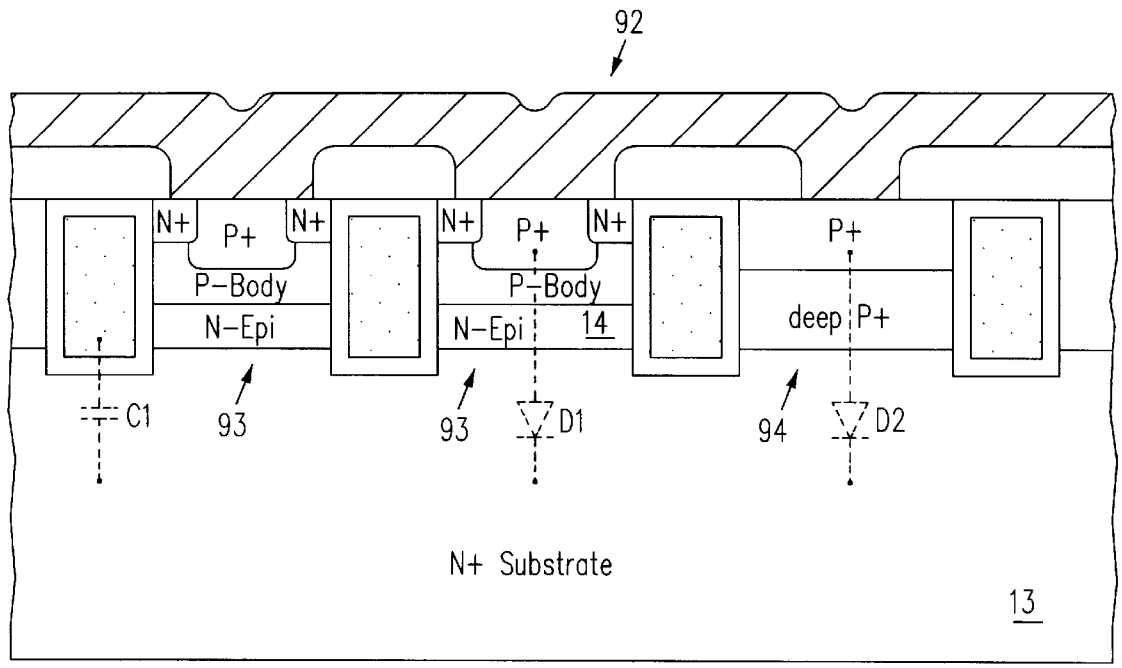
FIGS. 14, 15, 16 and 17 illustrate cross-sectional views of several embodiments in which the trenches extent into the heavily doped substrate.
Figure 15:
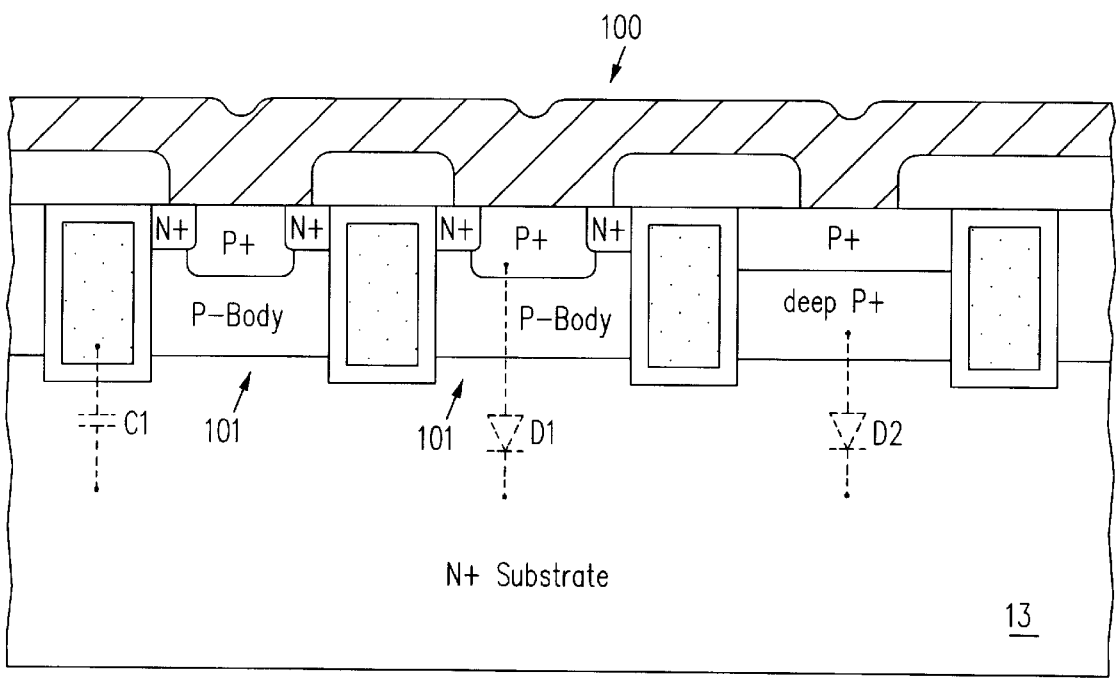
Figure 16:
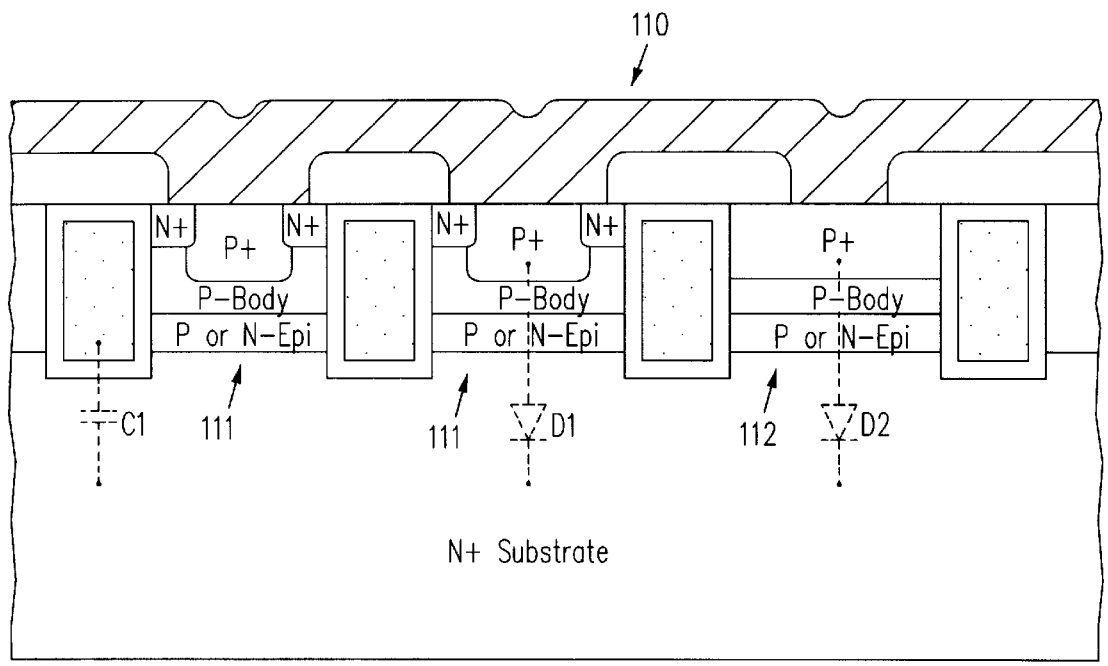

FIGS. 14–16 illustrate cross-sectional views of several alternative embodiments in accordance with the invention. FIG. 14 shows a MOSFET 92 in which the trenches extend into the N+ substrate 13. A thin layer of N-epitaxial layer remains in the MOSFET cells 93, while in diode cell 94 the protective P+ diffusion reaches the top surface of N+ substrate 13. In the MOSFET 100 shown in FIG. 15, the P-body regions in the MOSFET cells 101 extend to the top surface of the N+ substrate 13, and none of the N- doped region of epitaxial layer 14 remains. In the MOSFET 110 shown in FIG. 16, a thin section of the epitaxial layer 14, doped P- or N-, remains in each of the MOSFET cells 111 and the diode cell 112.

In FIGS. 14–16, diode D1 represents the PN junction within the MOSFET cells, diode D2 represents the PN junction in the protective diode cells, and a capacitor C1 represents the gate oxide layer abutted by the gate and the N+ substrate. In all three cases the relationship $BV_{D2} < 50\% \cdot BV_{C1}$ should hold, where $BV_{D2}$ is the breakdown voltage of diode D2 and $BV_{C1}$ is the breakdown voltage of capacitor C1. Also, the breakdown voltage of diode D2 is less than the breakdown voltage of diode D1 in each case.

Figure 2A:
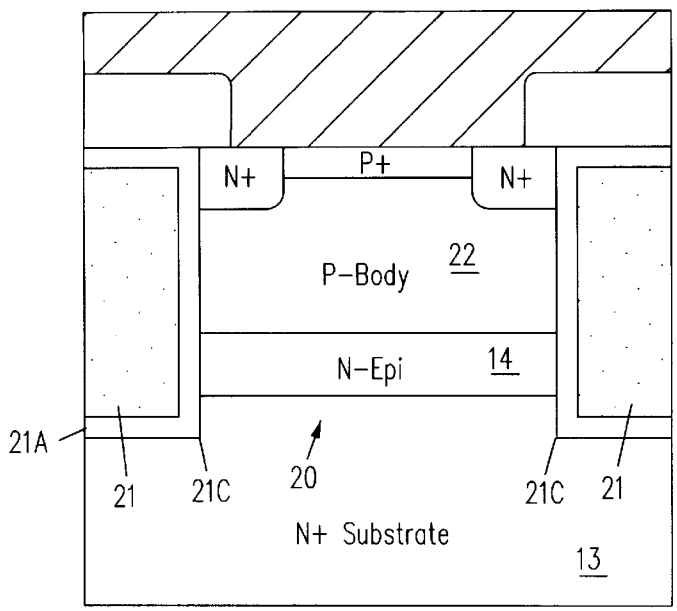
FIG. 2A illustrates a cross-sectional view of a conventional trench-gated MOSFET without a deep central diffusion and wherein the trenches extend into the substrate.
Figure 2B:
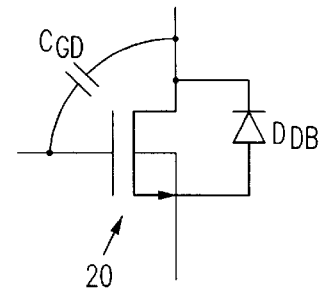
FIG. 2B illustrates an equivalent circuit diagram for the MOSFET of FIG. 2A.
Figure 3:
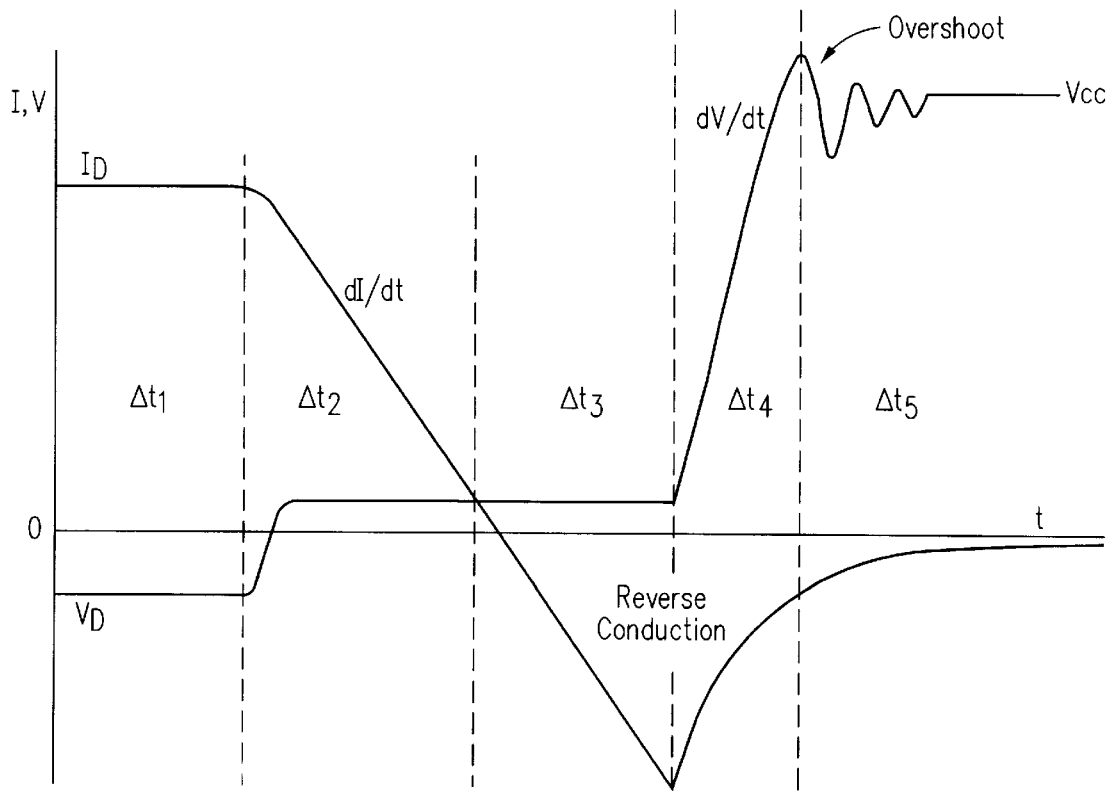
FIG. 3 is a graph showing how reducing the charge storage in a diode decreases the peak and duration of the reverse current.
Figure 17:
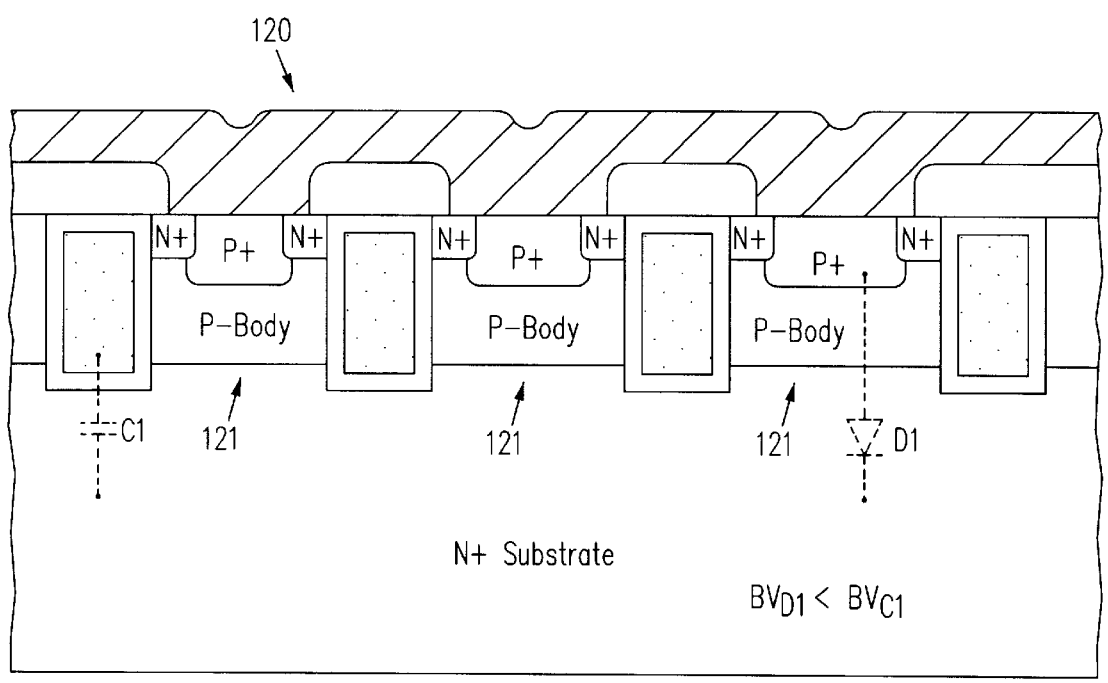

MOSFET 120, shown in FIG. 17, appears to be similar to the conventional MOSFET shown in FIG. 2A. Diode D1 represents the PIN diode formed at the center of each MOSFET cell by the combination of the shallow P+ contact region, the P-body and the N+ substrate. In MOSFET 120 the breakdown voltage of PIN diode D1 is set at less than 50% of the breakdown voltage of capacitors C1, wherein the breakdown voltage of the capacitors is calculated on the basis of 8 MV/cm for the thickness of the gate oxide layer expressed in centimeters. As a result, in MOSFET 120 breakdown will occur, if at all, in the central region of the individual cells and at a voltage which will not damage the gate oxide layers.

Figure 18A:
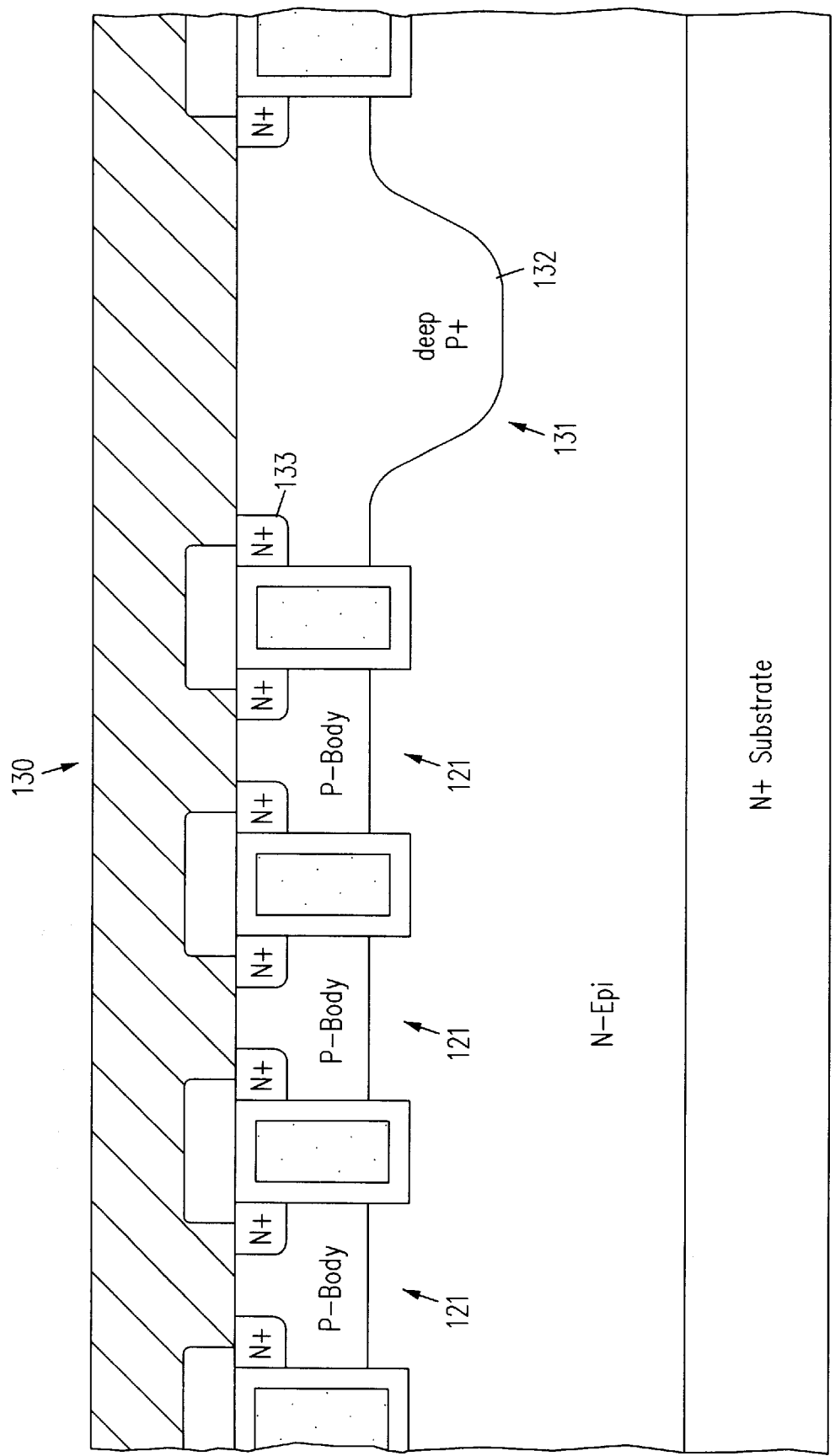
FIGS. 18A and 18B illustrate cross-sectional and top views, respectively, of a sixth embodiment, which includes a wide protective cell.
Figure 18B:
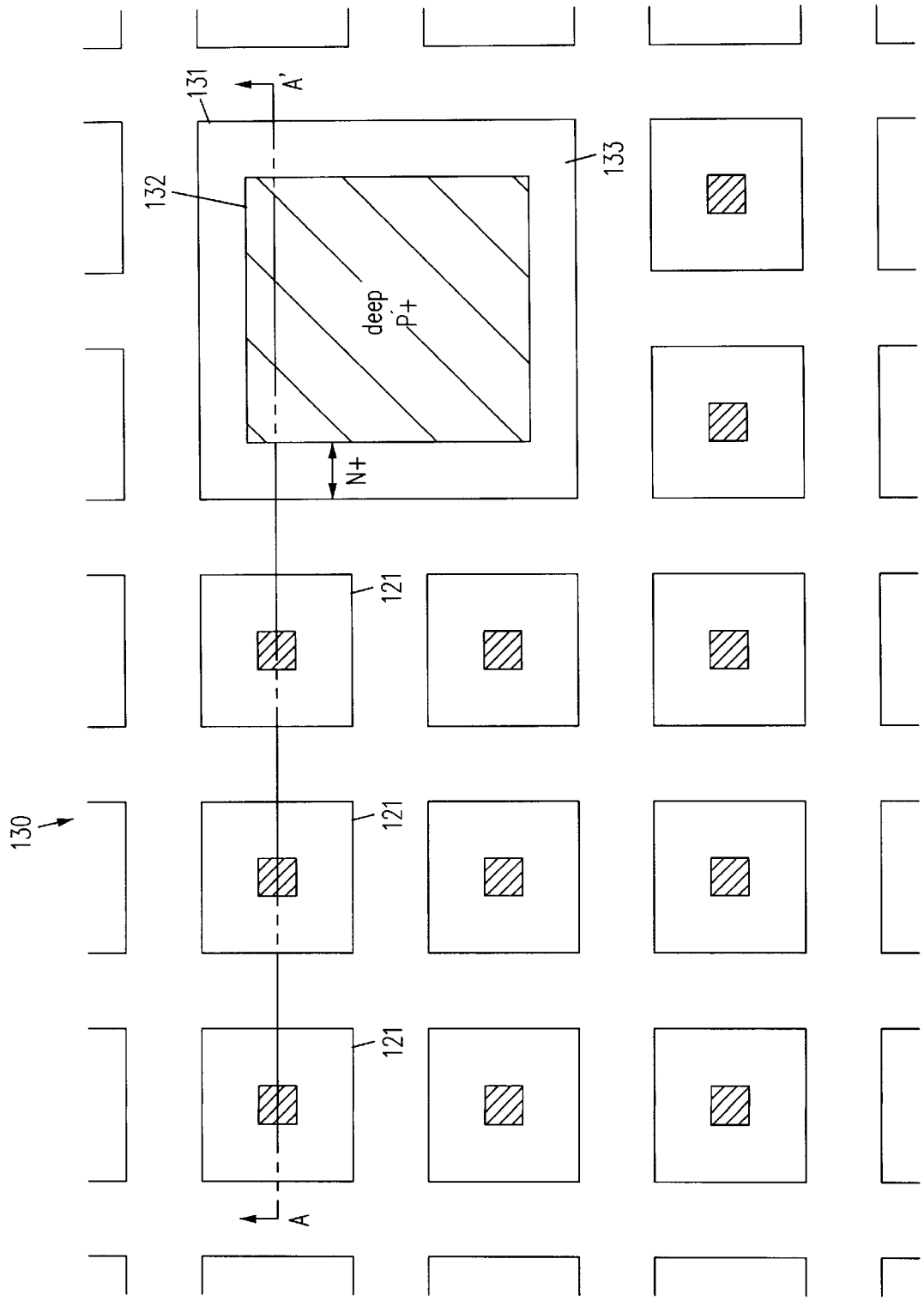

An embodiment containing a diode cell which is larger than the MOSFET cells is illustrated in FIGS. 18A and 18B, FIG. 18A being a cross-sectional view taken at section A-A' shown in the top view of FIG. 13B. MOSFET 130 includes cells 121 as well as a wider cell 131 which includes a deep P+ region 132. Deep P+ region 132 provides a protective function for the gate oxide layers in cells 121 while acting as an active MOSFET cell itself, having an N+ source region 133. Thus, while cell 131 reduces the overall cell density of the MOSFET, the penalty in terms of on-resistance is less than it would be if cell 131 performed only a protective function and carried no current. As in MOSFET 120 of FIG. 12, cells 121 are typically smaller than they would be if a protective deep P+ region were included in each cell.

Although there are numerous processes for fabricating a MOSFET in accordance with this invention, FIGS. 19A–19K illustrate an exemplary process for fabricating MOSFET 30 shown in FIG. 4. The step of the process are summarized in the flowchart of FIG. 20.

Figure 19A:
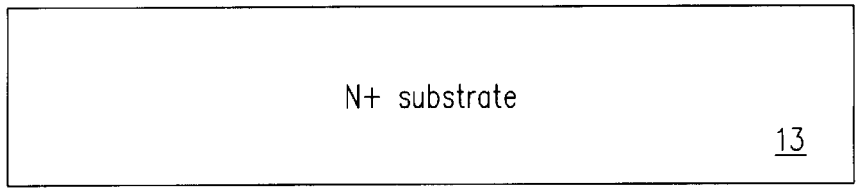
FIGS. 19A–19K illustrate the steps of a process of fabricating a MOSFET of the kind shown in FIG. 4.
Figure 20A:
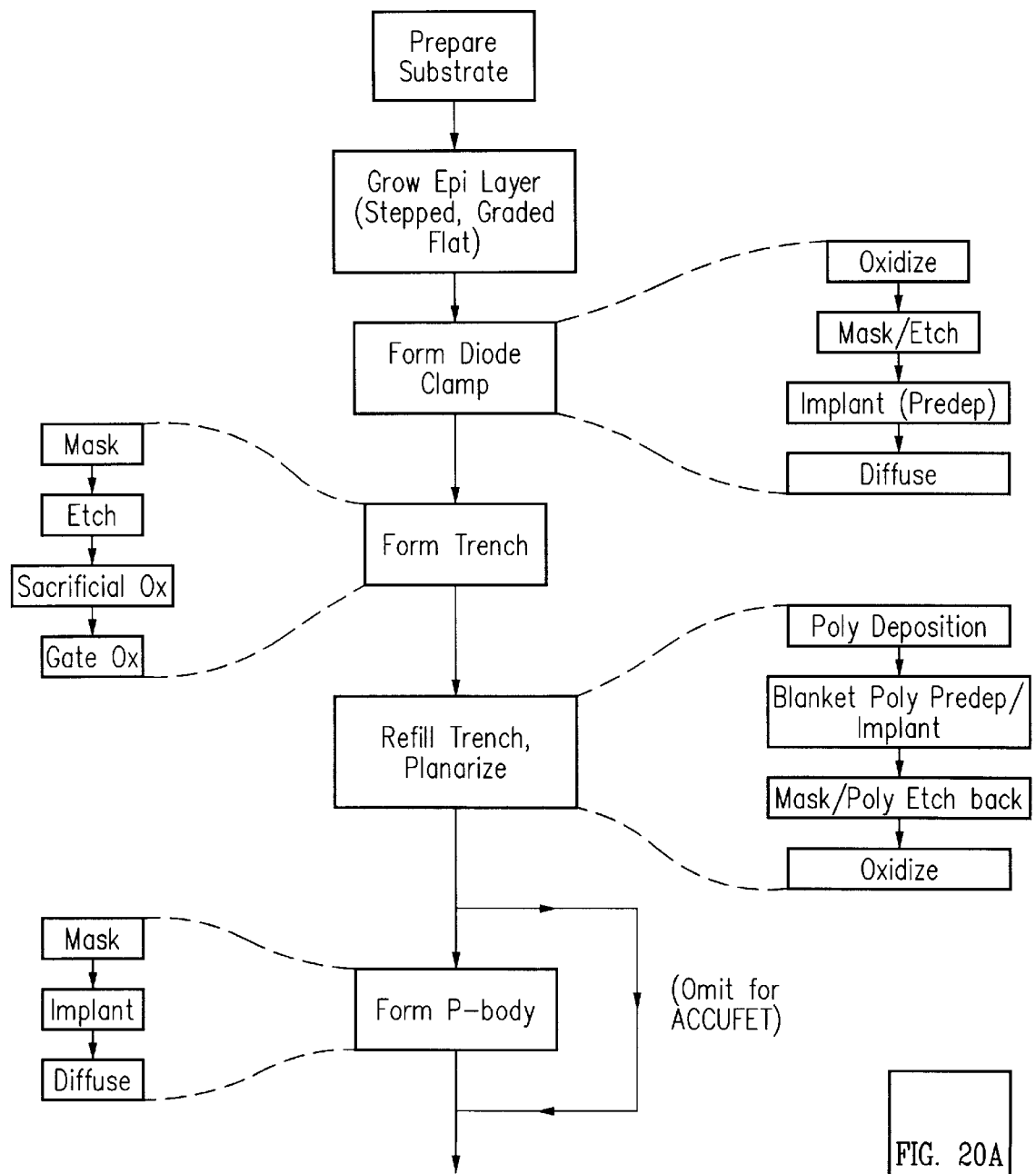
FIGS. 20A and 20B show a flowchart summarizing the process shown in FIGS. 19A–19K.
Figure 20B:
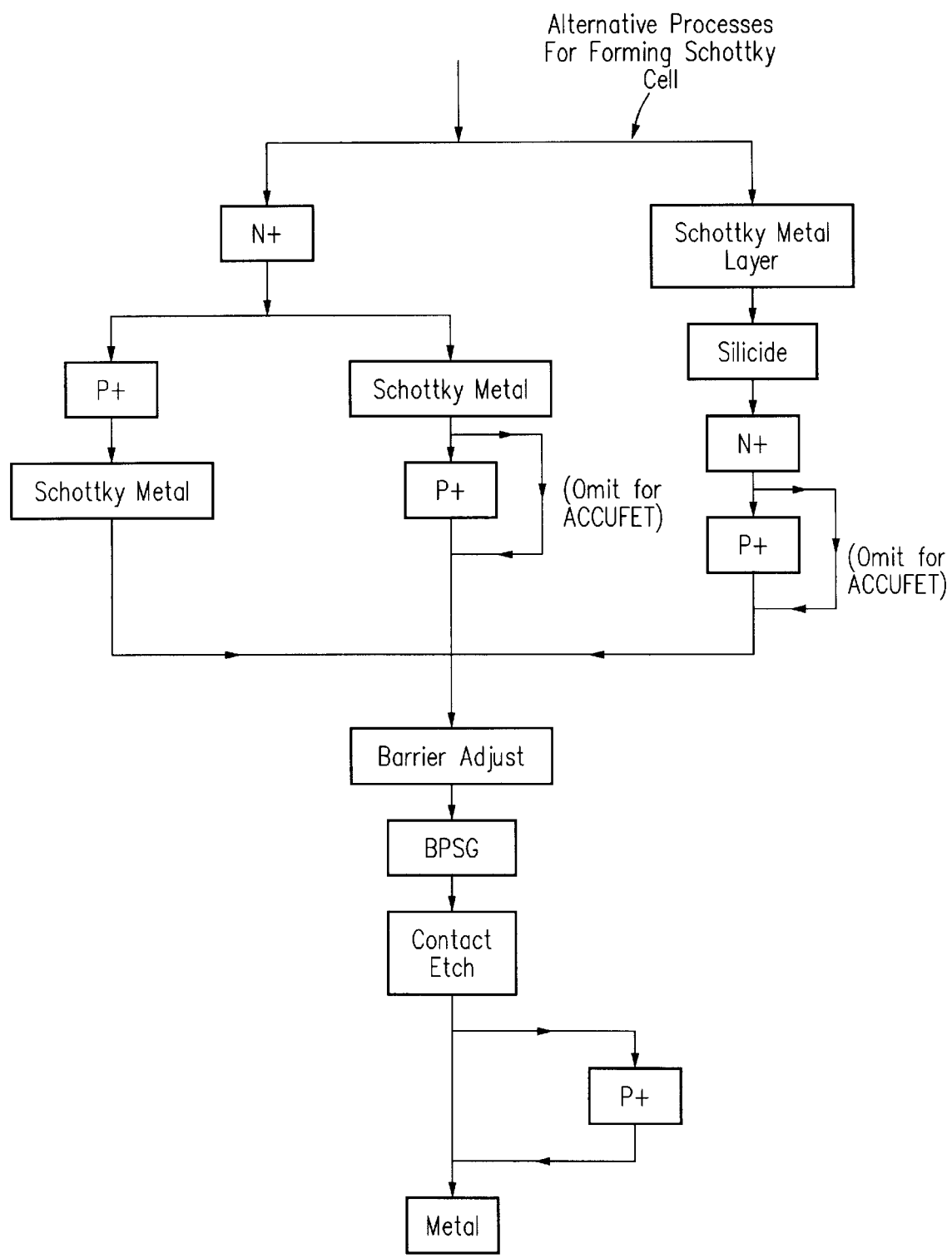

Referring to FIG. 19A, the starting point is a silicon substrate which is doped with arsenic to a conductivity in the range of 1–100 mΩ-cm (for example 2 mΩ-cm) to yield N+ substrate 13. If a P+ substrate is desired for a P-channel device, the substrate could be doped with boron.

Figure 19B:
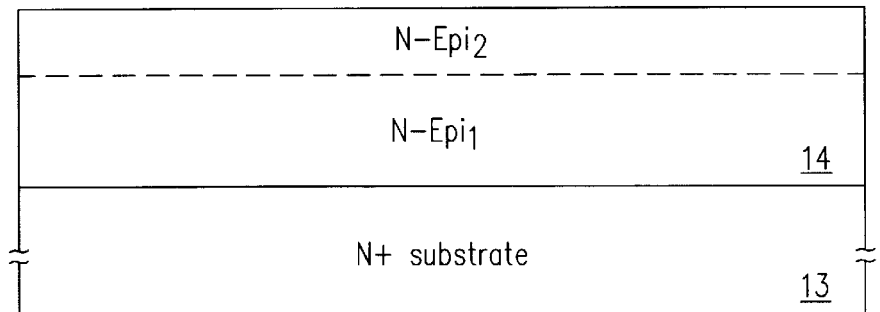

As shown in FIG. 19B, an epitaxial (epi) layer 14 is grown on N+ substrate 13 using known processes. Epi layer 14 can include sublayers $Nepi_1$ and $Nepi_2$ as shown it could include a single uniform layer or a graded layer. The thickness of epi layer 14 is typically in the range 1–60 μm and is doped to a concentration in the range of $3 \times 10^{14}$ to $3 \times 10^{17}$ cm$^{-3}$. With an N-type epi the dopant is typically phosphorus (boron can be used for a P-type epi). For a 12 V device, a single epi layer 3 μm thick could be doped to $1 \times 10^{17}$ cm$^{-3}$, or a lower 2 μm thick sublayer $Nepi_1$ could be doped to $1 \times 10^{17}$ cm$^{-3}$ and an upper 2 μm thick sublayer $Nepi_2$ could be doped to $5 \times 10^{16}$ cm$^{-3}$. For a 30 V device, a single epi layer 6 μm thick could be doped to $5 \times 10^{16}$ cm$^{-3}$, or a lower 4 μm thick sublayer $Nepi_1$ could be doped to $6 \times 10^{16}$ cm$^{-3}$ and an upper 3 μm thick sublayer $Nepi_2$ could be doped to $3 \times 10^{16}$ cm$^{-3}$. For a 60 V device, a single epi layer 10 μm thick could be doped to $9 \times 10^{15}$ cm$^{-3}$, or a lower 7 Am thick sublayer $Nepi_1$ could be doped to $1-2 \times 10^{16}$ cm$^{-3}$ and an upper 3 μm thick sublayer $Nepi^2$ could be doped to $0.7-1.0 \times 10^{16}$ cm$^{-3}$. For a 100 V device, a single epi layer 13 μm thick could be doped to $5 \times 10^{15}$ cm$^{-3}$.

Figure 19C:
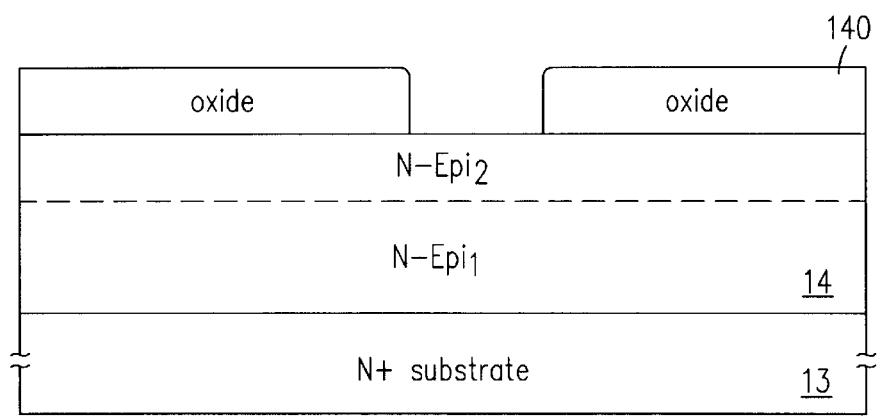
Figure 19D:
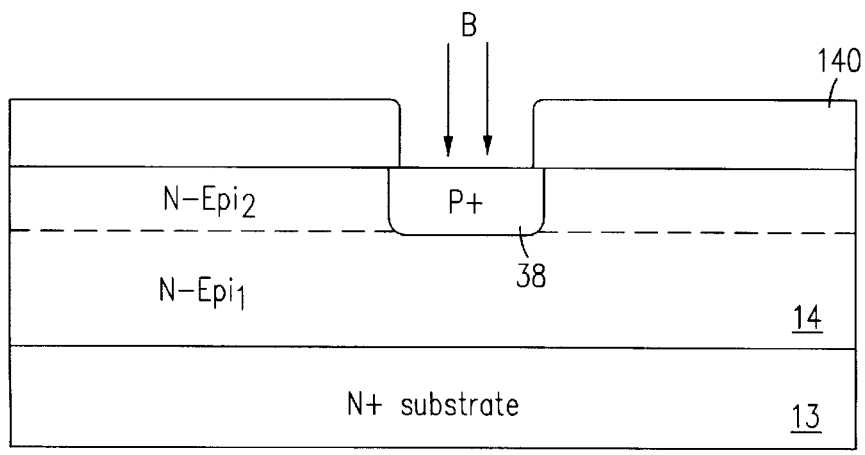

As shown in FIG. 19C, a thick oxide layer 140 having a thickness of 0.3–1.0 μm (e.g., 0.5 μm) is grown at 900–1100 C for 30 minutes to 10 hours and is then masked and etched to define the location of deep P+ region 38. As shown in FIG. 19D, boron is then implanted at a dose of $1 \times 10^{15}$ to $1 \times 10^{16}$ cm$^{-2}$ and an energy of 20–100 keV (e.g., $5 \times 10^{15}$ cm$^{-3}$ at 60 keV) to form P+ region 38. The resulting structure is illustrated in FIG. 19D.

Alternatively, the deep P+ region 38 can be formed by predeposition using a gaseous or solid source such as BN which outgases during the furnace cycle (950–1000° C.), thereby doping the region to a sheet resistance of 20 to 200 Ω/square (e.g. 70 Ω/square). If a P-channel device is desired, the dopant source may be POCl$_3$, producing a highly doped N+ region.

Figure 19E:
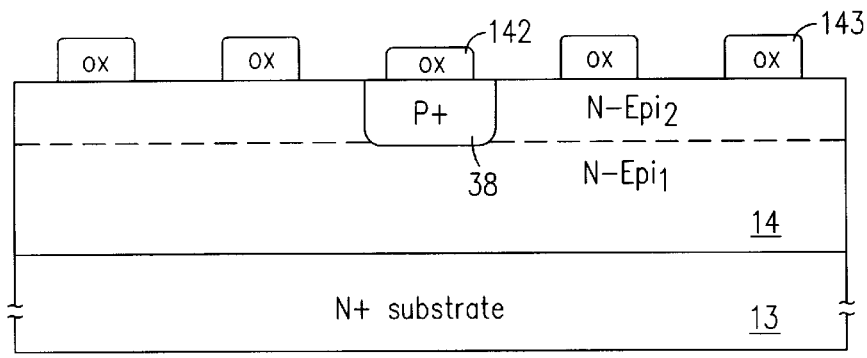

In one version of the process, a thick oxide layer 142 is grown and removed by photomasking except over deep P+ region 38, and a thin oxide layer 143 is grown. Thin oxide layer 143 is masked and removed from the portions of the structure where the trenches are to be formed, as shown in FIG. 19E. P+ region 38 is diffused at 900–1100° C. (e.g. 1050° C.) for 30 minutes to 10 hours (e.g. 3 hours) to drive it in to a depth of 1–6 μm (e.g. 2–3 μm). Oxide layer 140 is then removed.

Figure 19F:
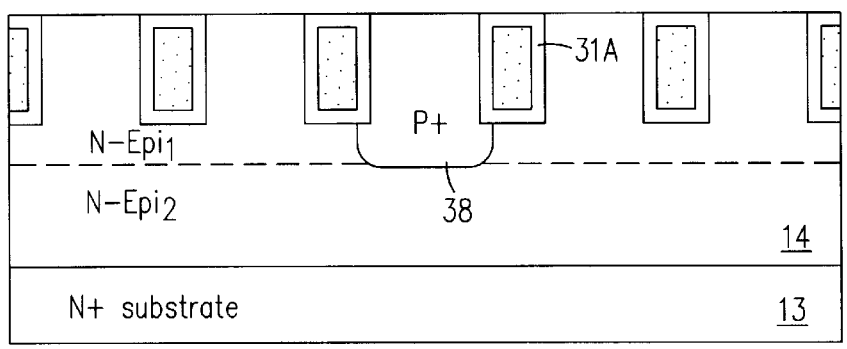
Figure 19G:
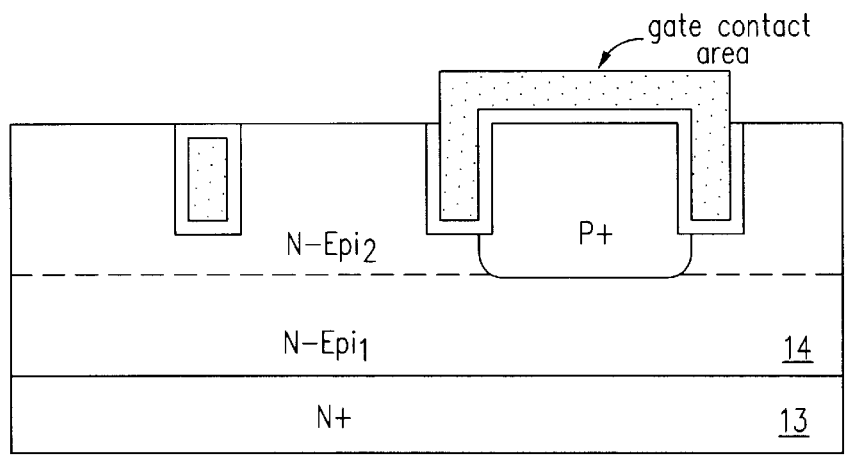

The trenches are then masked and etched to a depth of 1–7 μm (e.g. 1.8–2.5 μm) using known techniques of reactive ion or plasma dry etching. The corners of the trench can be rounded by changing the gas mix. A 100–2000Å sacrificial oxide layer is grown on the walls of the trenches by heating to 900–1100° C. for 20 minutes to 5 hours. After the sacrificial oxide has been stripped, the trench is oxidized to form gate oxide layer 31A, and polysilicon is deposited into the trench until it overflows the top of the trench. The polysilicon is then doped with phosphorus by POCl$_3$ predeposition or ion implantation at a dose of $5 \times 10^{13}$ to $5 \times 10^{15}$ cm$^{-2}$ and an energy of 60 keV, giving it a sheet resistance of 20–70 Ω/square. For a P-channel device, the polysilicon is doped with boron using ion implantation to a sheet resistance of roughly 40–120 Ω/square. The polysilicon is then etched back until it is planar with the surface of the trench except where a mask protects it, so that it can subsequently be contacted with metal. The resulting structure is shown in FIG. 19F. (As shown in FIG. 19G, the polysilicon is not planarized to the surface of the trench in the area where the gate contact is to be formed.)

Figure 19H:
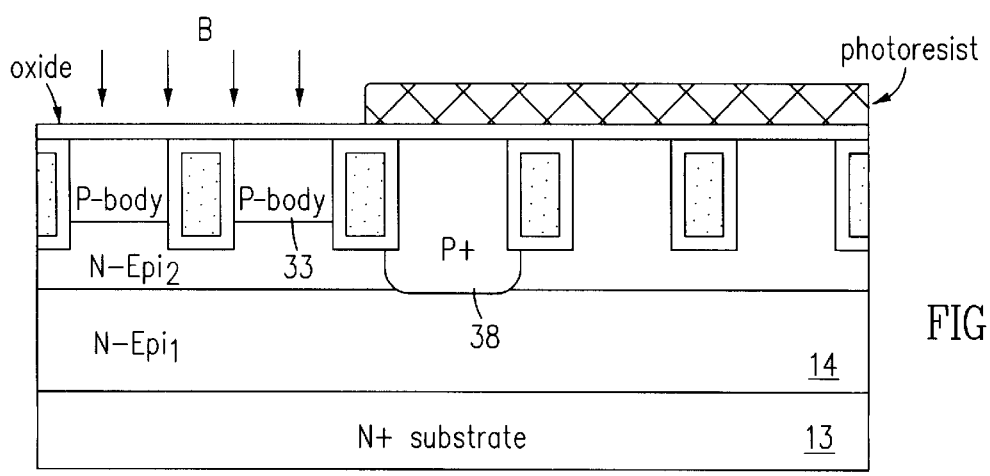

As shown in FIG. 19H, a layer of photoresist is patterned and P-body 33 is then formed by implanting boron through a thin oxide layer at a dose of $1 \times 10^{13}$ to $3 \times 10^{14}$ cm$^{-2}$ (e.g. $8 \times 10^{13}$ cm$^{-2}$) and an energy of 20–120 keV (e.g. 60 keV). P-body 33 is driven in to a depth of 1–4 μm but in no event beyond the bottom of the trench (e.g. 1.5 μm or of the trench depth) at 1000–1150° C. for 1–16 hours. A similar method is used in fabricating a P-channel device except that the dopant is phosphorus.

Figure 19I:
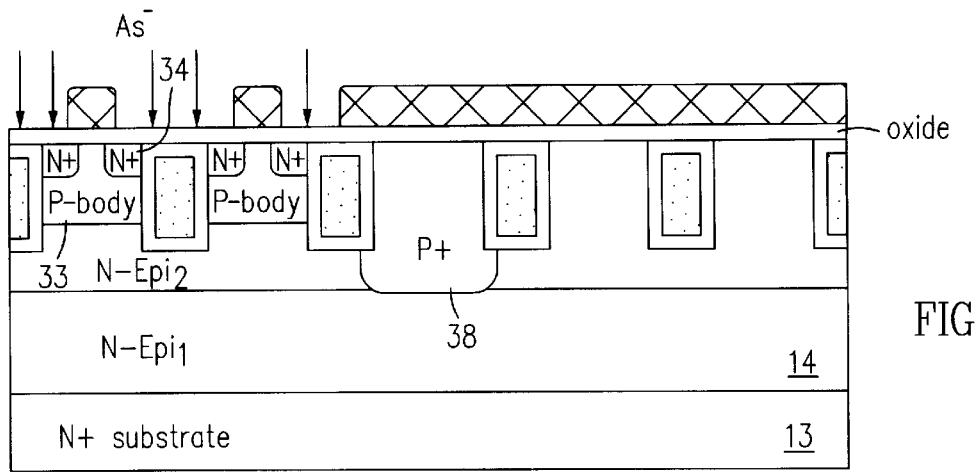

The N+ source regions 34 are then introduced using a mask and an arsenic ion implantation (or a boron ion implantation for a P-channel device) at a dose of $1 \times 10^{15}$ to $1 \times 10^{16}$ cm$^{-2}$ (e.g. $5 \times 10^{15}$ cm$^{-3}$) at 60 to 150 keV (e.g. 90 keV). Afterward the substrate is annealed to drive the N+ source regions 34 in to a depth of 0.5–1.0 μm (typically 1.0 μm). The resulting structure is shown in FIG. 19I.

Figure 19J:
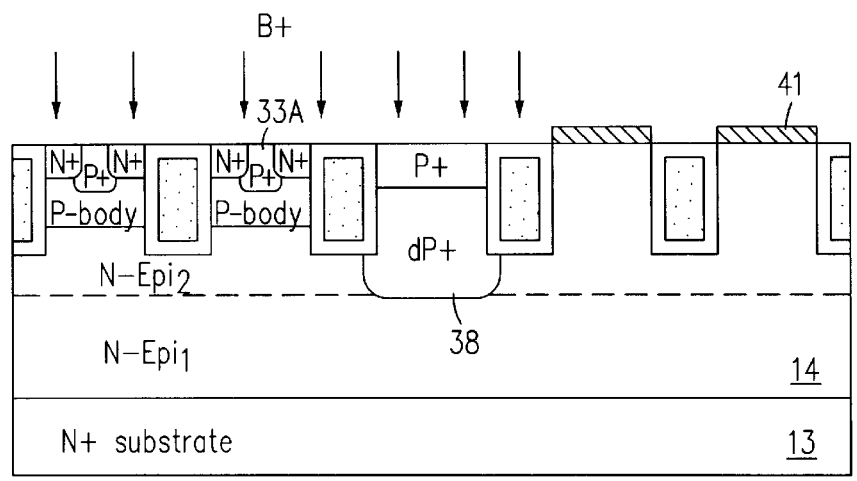
Figure 19K:
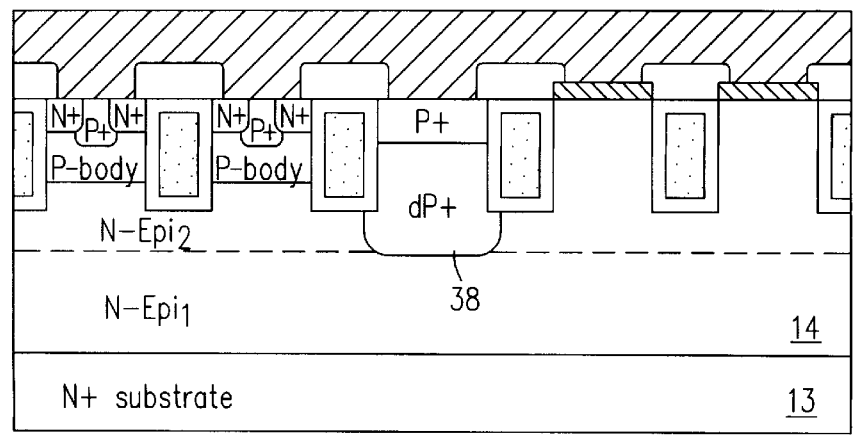

As shown in FIG. 19J, following the formation of the N+ source regions 38, a new mask (not shown) is formed and the shallow P+ regions 33A that are used to contact the P-body are introduced by boron implantation at a dose of $1 \times 10^{15}$ to $1 \times 10^{16}$ cm$^{-2}$ (e.g. $2 \times 10^{15}$ cm$^{-2}$) at 30–120 keV (e.g. 60 keV). P+ regions 33A are driven in to 0.8–2.0 μm (e.g. 1.2 μm) by an anneal process.

Alternatively, shallow P+ region 33A can be formed by implanting P-type dopant through the same mask that is used in forming the contact holes for the N+ source region/P+ contact region and the deep P+ region. Although with this technique some of the P-type dopant is implanted into N+ source region 34, the level of P-type doping is not sufficient to significantly affect the concentration of N-type ions in the N+ source region.

The Schottky metal layer 41 is then deposited. Such a metal may be evaporated, sputtered or deposited by organometallic CVD methods. For example, Ti can be sputtered and then annealed. If the metal is annealed at a temperature above 500° C., metal-silicides will be formed, e.g., W-silicide, Pt-silicide, or Ti-silicide. A layer 200Å to 2 μm thick may be used. An implant of boron or phosphorus is performed either before or after the Schottky metal layer 41 is deposited to adjust the energy barrier between the Schottky metal and the underlying silicon. Implant doses ranging from $5 \times 10^{11}$ cm$^{-2}$ to $1 \times 10^{14}$ cm$^{-2}$ can be used for this purpose, with $1 \times 10^{12}$ cm$^{-2}$ being a useful value.

A thin oxide layer is thermally grown. Borophosphosilicate glass (BPSG) is then deposited on the surface of the structure. The BPSG is momentarily heated to around 850 to 950 C to flow smoothly and flatten the surface topology of the die. Contact holes are etched in the oxide and BPSG layers, using a reactive ion or plasma etch, and metal layer 36 is deposited, forming contacts with the source and body regions, the deep P+ region, and the Schottky metal layer through the contact holes. Metal layer 36 can be aluminum containing 2% copper to prevent electromigration and 2% silicon to prevent pitting. Metal layer 36 can be 5000 to 4 μm thick (2.8 μm thick). This yields a MOSFET similar to MOSFET 30 shown in FIG. 4.

To fabricate a device containing an ACCUFET as shown in FIG. 8, the implantation of the P-body is omitted.

The die is then passivated with SiN or BPSG, and pad mask windows are etched to facilitate bonding.

Figure 21A:
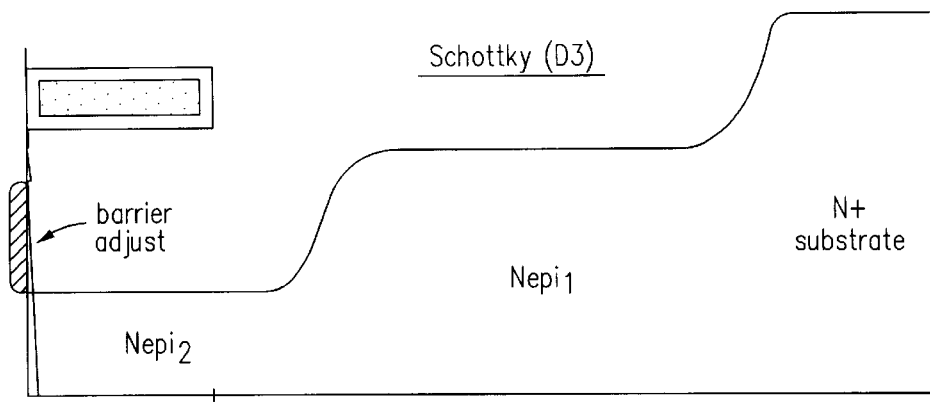
FIGS. 21A–21D show graphs of the dopant concentrations at various vertical sections of the MOSFET.
Figure 21B:
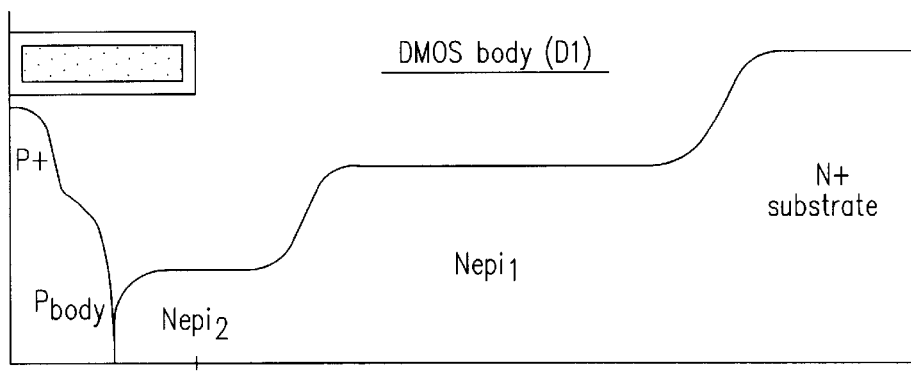
Figure 21C:
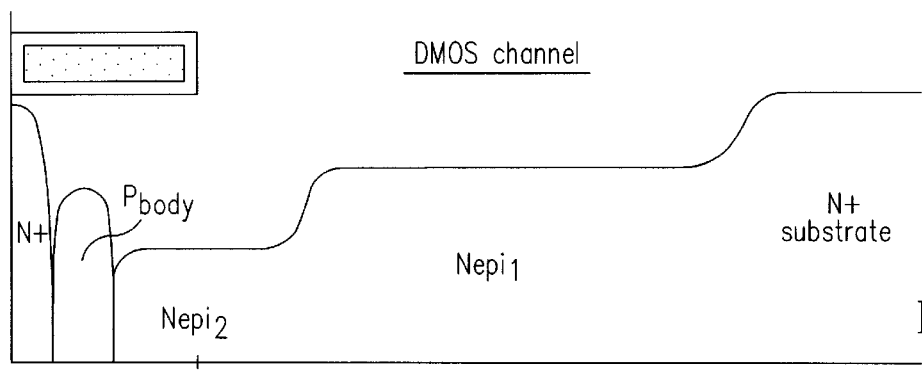
Figure 21D:
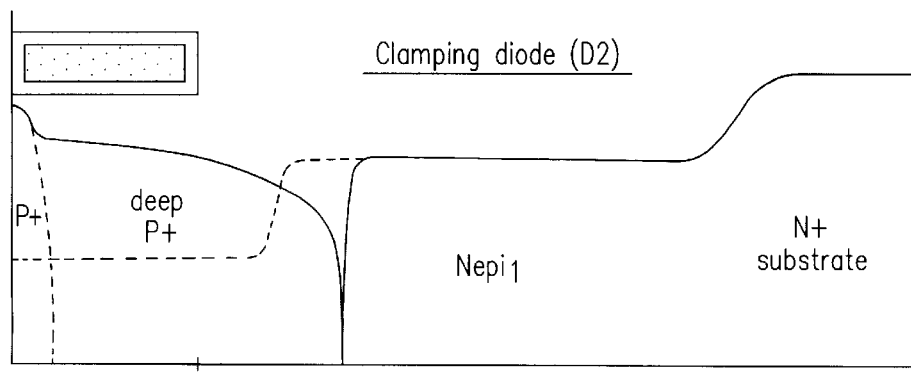

FIGS. 21A–21D are graphs showing the dopant concentration levels in various vertical sections of the MOSFET. FIG. 21A shows the concentration of N-type dopant in the Schottky cell (diode D3); FIG. 21B shows the concentration of P-type and N-type dopant in the central region of the MOSFET cell (diode D1); FIG. 21C shows the concentration of P-type and N-type dopant in the channel region of the MOSFET cell; and FIG. 21D shows the concentration of N-type and P-type dopant in the diode cell (diode D2). In each figure the depth of the trench is indicated. The relative depths of the various layers represents a typical implementation but is not meant to preclude other possible depth combinations. In general, the clamping diode extends deepest into the sublayer Nepi$_1$ but no other structure extends into the sublayer Nepi$_1$. The other structures are localized within Nepi$_2$. The P-body is necessarily shallower than the trench and the N+ is shallower the P-body. The P+ region is generally deeper than the N+ region but shallower than the P-body. The barrier adjust implant is the shallowest.

Various structures may be used to insure that the breakdown of the diode cell occurs away from the trench and the gate oxide layer and also to regulate the breakdown voltage of the diode.

Figure 22B:
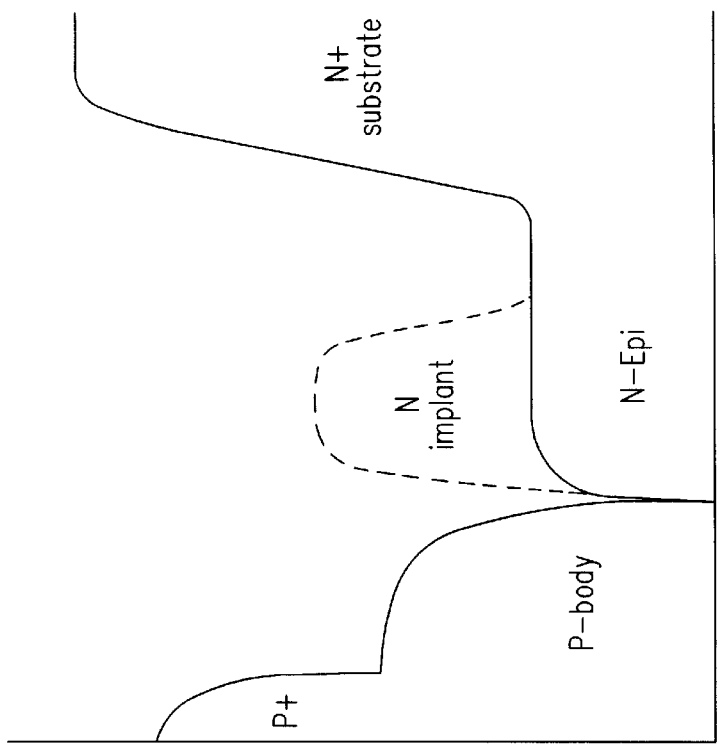
FIG. 22B illustrates a graph showing the dopant concentrations in the embodiment of FIG. 22A.
Figure 22A:
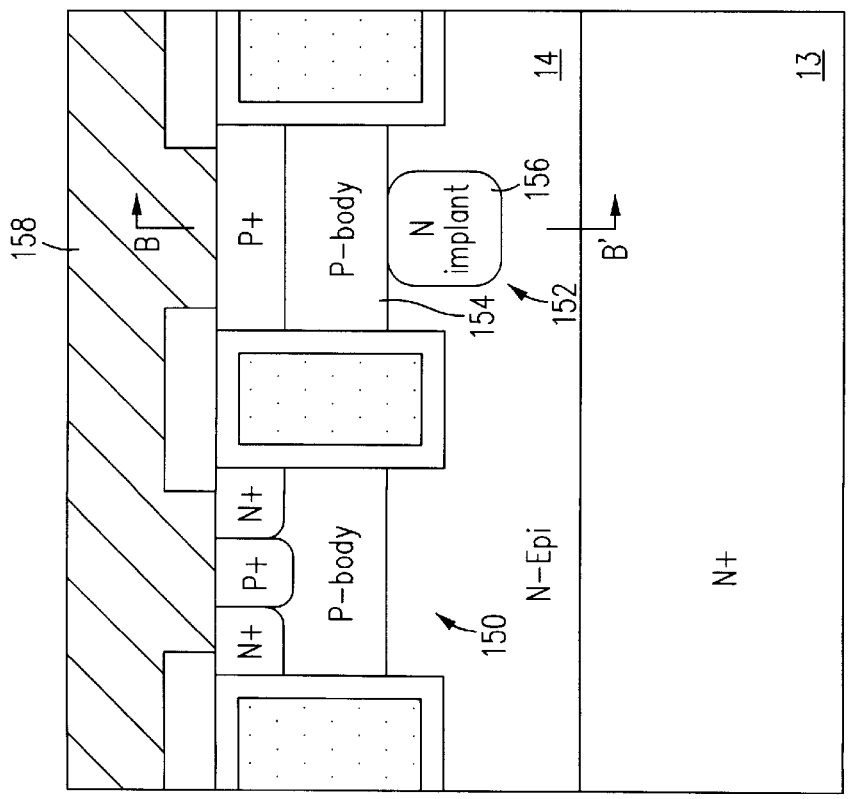
FIG. 22A illustrates a seventh embodiment wherein a breakdown voltage control region having a dopant concentration higher than that of the epi-layer is implanted in the diode cell.

In FIG. 22A MOSFET cell 150 contains no central P+ diffusion and thus is similar to MOSFET cell 35 in FIG. 4. Diode cell 152 contains a P-body diffusion 154, and an N-type breakdown voltage control region 156 is formed directly beneath the P-body diffusion at the center of diode cell 152. By raising the dopant concentration of the N-epi layer 14 in the region of breakdown voltage control region 156, the breakdown voltage of diode cell 152 is reduced locally at the center of the cell thereby insuring that this is where breakdown will occur. Breakdown voltage control region 156 can be formed as a part of the body diffusion or it could be implanted, for example, at a dose of $2\times10^{13}$ to $2\times10^{15}$ cm$^{-2}$ and at an energy of 200 keV to 3 MeV through the metal contact layer 158 (with 1.5 MeV being typical). Alternatively, breakdown voltage control region 156 can be formed as buried layer by creating an updiffusion from the interface between N+ substrate 13 and N-epi layer 14. For example, if N+ substrate is doped with arsenic, the updiffusion could be created with phosphorus. The updiffusion could extend all the way to the P-body diffusion 154 or it could stop short of P-body diffusion 154. The important consideration is that by increasing the dopant levels in the N-epi layer at the center of diode cell 152 the breakdown voltage of the diode is reduced and the breakdown is localized in the region of the increased dopant levels.

FIG. 22B is a graph showing the dopant concentration at the cross-section B-B' in FIG. 22A. The dopant of breakdown voltage control region 156 is shown by the dashed line. The peak dopant concentration in the breakdown voltage control region could be, for example, from 10% to 100% higher than the background level in N-epi layer 14. The concentration of dopant at the center of the cell allows improved current spreading.

Figure 23A:
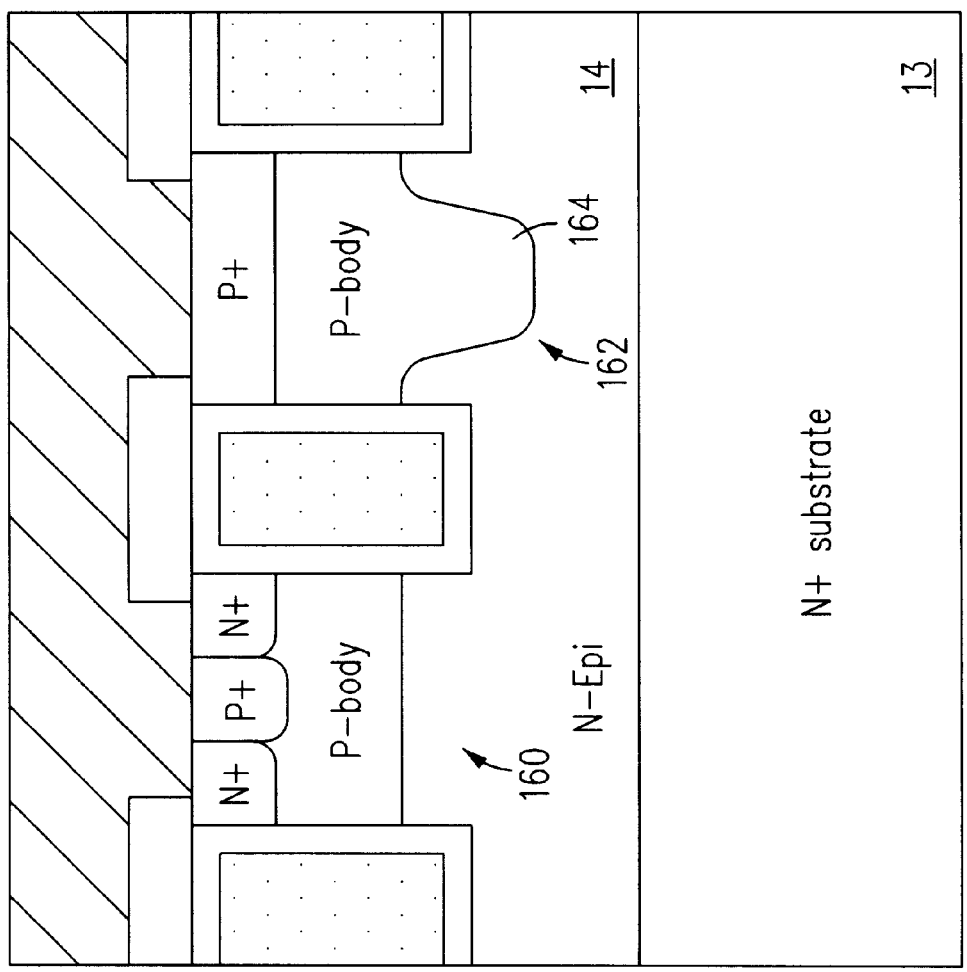
FIG. 23A illustrates a embodiment wherein the diode cell contains a deep diffusion which forms a curved junction with the background doping in the epi layer.
Figure 23D:
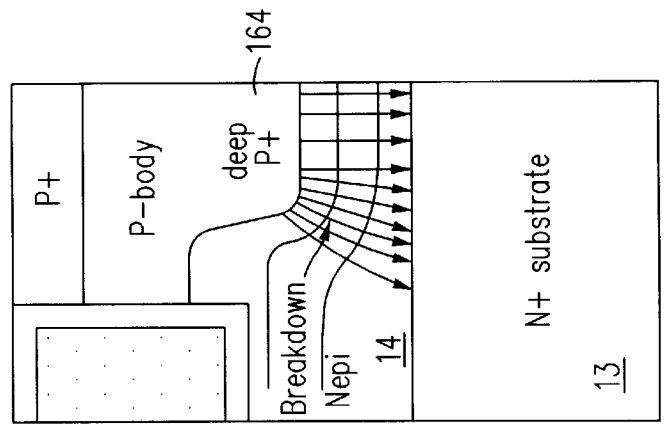
FIGS. 23B–23D illustrate how the curvature of the deep diffusion and the proximity of the deep diffusion to the substrate can be used to control the breakdown voltage of the diode cell.

FIG. 23A illustrates a conventional vertical MOSFET cell 160 along with a diode cell 162. Diode cell 162 contains a deep central P+ diffusion 164 which forms a PN junction with N-epi layer 14. FIG. 23B shows how the breakdown occurs if the N-epi layer 14 is doped fairly heavily, the PN junction is well defined (deep P+ diffusion was exposed to a minimal amount of thermal processing) and includes a curved segment 166 which has a rather small radius of curvature, and the deepest point of the deep P+ diffusion 164 is well separated from the N+ substrate 13. As shown in FIG. 23B, when a reverse voltage is imposed on the PN junction between P+ diffusion 164 and N-epitaxial layer 14 breakdown occurs primarily in the curved segment 166 of the PN junction, and a current flows radially outward from the curved segment 166. The magnitude of the breakdown voltage is strongly dependent on the radius of curvature of the curved segment 166. The smaller the radius of curvature, the lower the breakdown voltage. (See S. M. Sze, *Physics of Semiconductor Devices*, Second Edition, John Wiley & Sons (1981), p. 108, FIG. 35) In this situation the deep P+ diffusion 164 does not necessarily have to extend below the trench in order to provide satisfactory protection for the gate oxide layer.

Figure 23C:
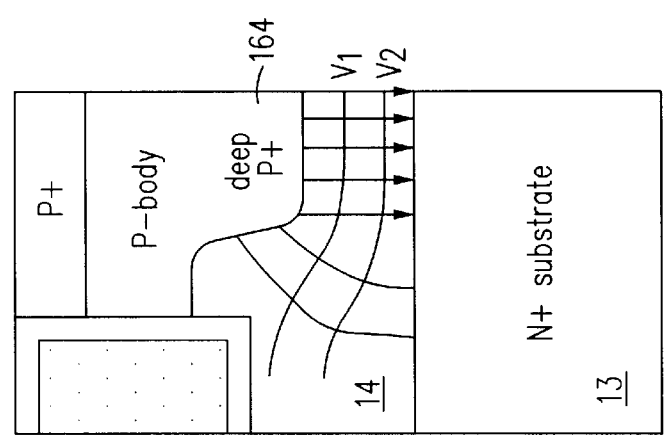
Figure 23B:
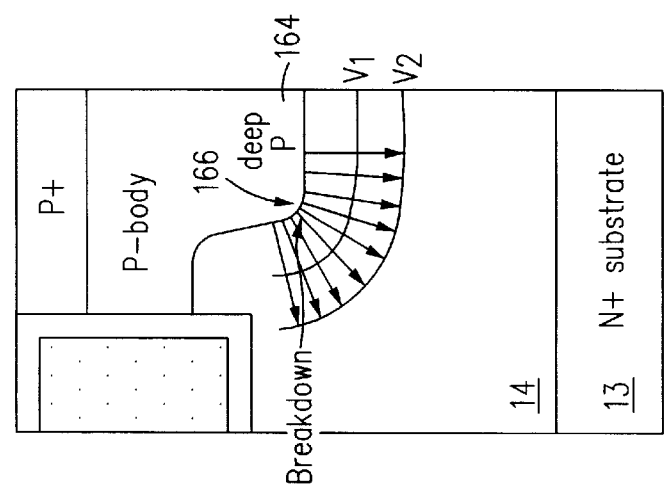

In FIG. 23C the N-epi layer is doped less heavily, the deep P+ diffusion 164 extends much closer to the N+ substrate 13, and the PN junction between the P-body diffusion is less defined. Here a PIN diode is formed with the N-epi layer 14 acting as an "intrinsic layer" sandwiched between the deep P+ diffusion 164 and the N+ substrate 13. As shown in FIG. 23C breakdown occurs predominately in a vertical direction. The magnitude of the breakdown voltage depends primarily on the doping concentration of the N-epi layer 14 and the width of the N-epi layer 14 between deep P+ diffusion 164 and N+ substrate 13.

FIG. 23D shows an embodiment in which both of the effects shown in FIGS. 23B and 23C are present. That is, breakdown occurs both from the effects of the radius of curvature of the PN junction between deep P+ diffusion 164 and N-epi layer 14 and the PIN diode formed by deep P+ diffusion 164, N-epi layer 14 and N+ substrate 13.

As this discussion indicates, the breakdown voltage can be controlled by varying the radius of curvature of the PN junction between deep P+ diffusion 164 and N-epi layer 14. FIG. 24A shows an embodiment where the P+ diffusion 174 in diode cell 170 is kept well above the bottom of the trench and yet the breakdown voltage in diode cell 170 is set at an acceptable level solely by controlling the radius of curvature of the PN junction between P+ diffusion 174 and N-epi layer 14.

Figure 24B:
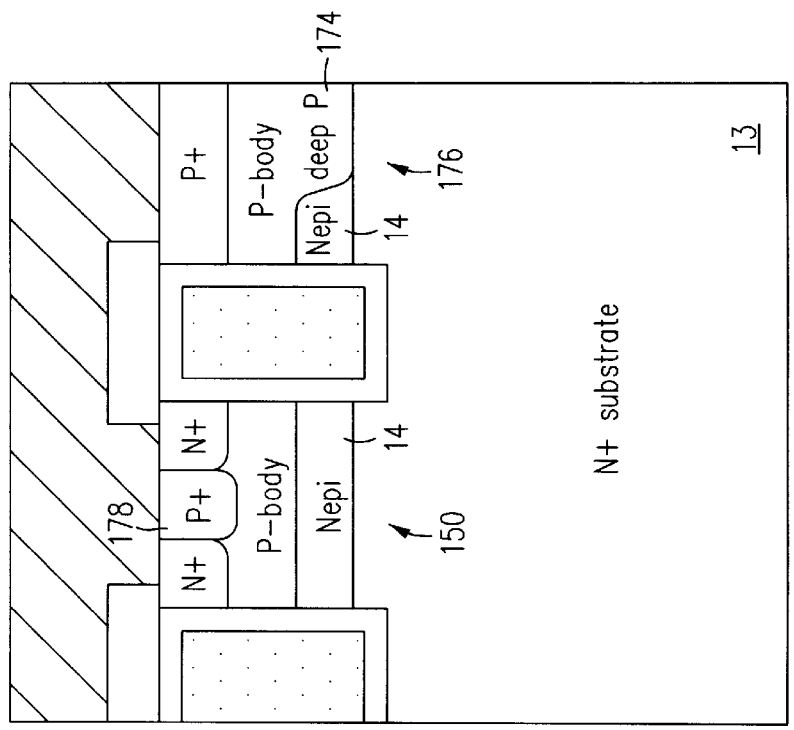
FIG. 24B illustrates an embodiment similar to that shown in FIG. 24A except that the gate trench extends into the substrate.
Figure 24A:
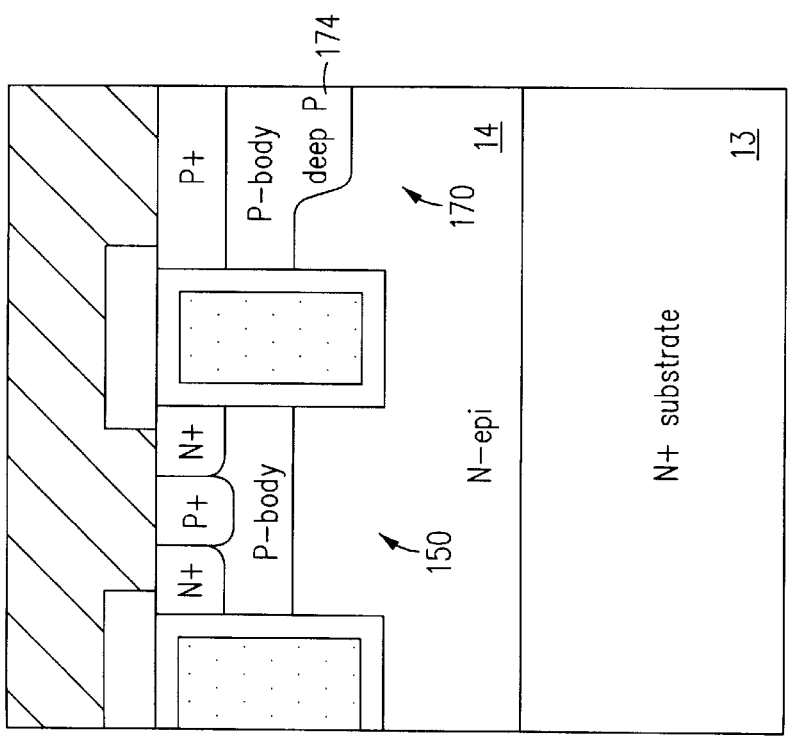
FIG. 24A illustrates an embodiment wherein the diffusion in the diode cell is maintained at a level above the bottom of the gate trench of the MOSFET.
Figure 24C:
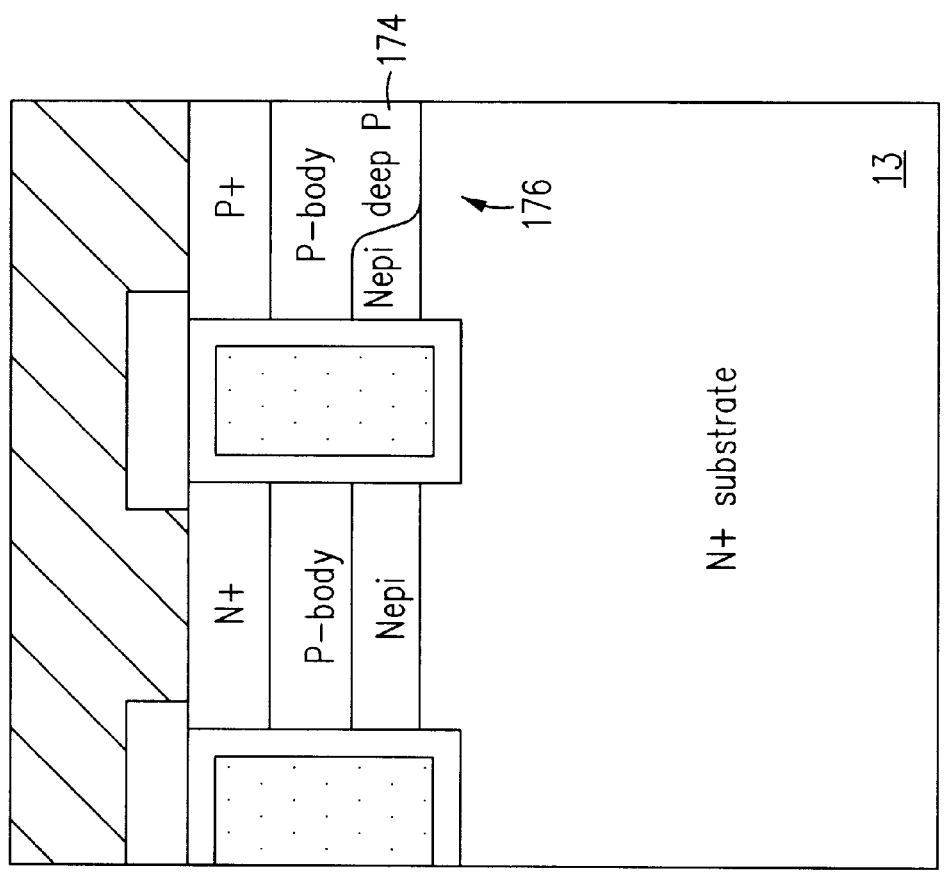
FIG. 24C illustrates an embodiment similar to that shown in FIG. 24B except that the body region in the MOSFET cell does not reach the surface of the epi layer.

The embodiment of FIG. 24B is similar but here the N-epi layer 14 is so thin that the trench extends into N-epi layer 14. Diode cell 176 contains a small slice of N-epi layer 14. The magnitude of the breakdown voltage of diode cell 176 is set by the PN junction between deep P+ region 174 and N+ substrate 13. As described above, this magnitude should be set at a voltage which is less than the thickness of the gate oxide layer (cm) multiplied by 4 MV/cm. The embodiment of FIG. 24C is similar, but the process of driving in the deep P+ diffusion 174 has resulted in the elimination of the P+ body contact region 178 in MOSFET cell 150. Thus the P-body region must be fully depleted of charge carriers and must be contacted, if at all, in another location of the power MOSFET.

Figure 25A:
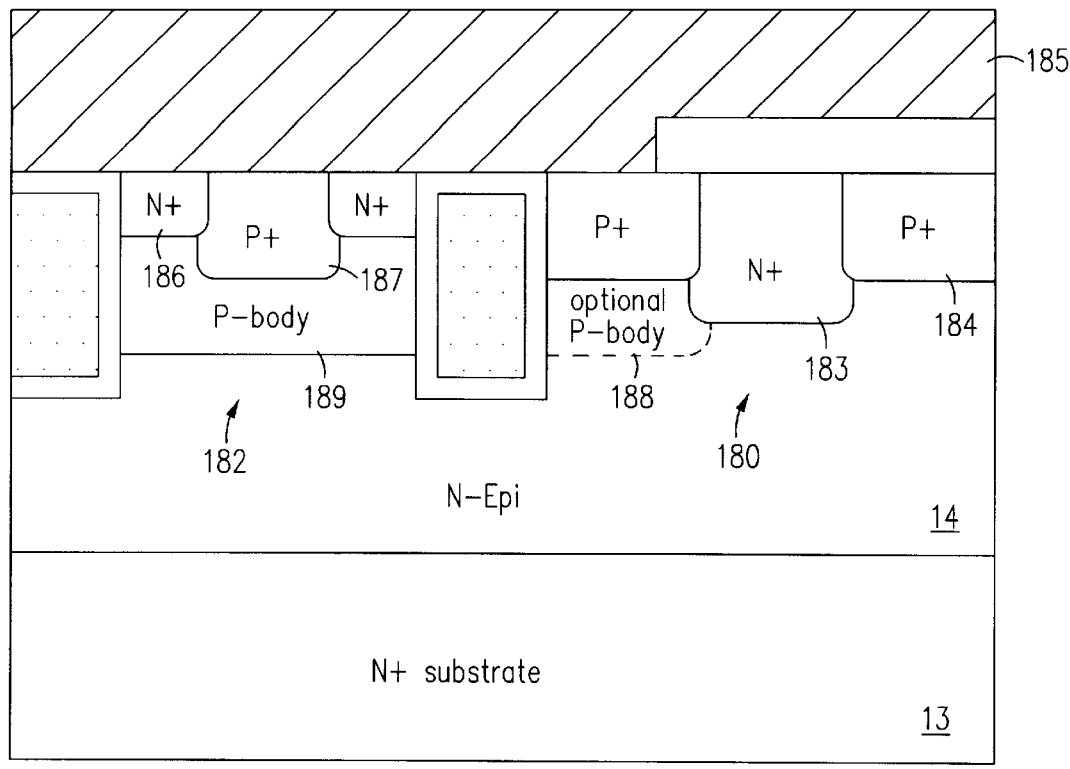
FIG. 25A illustrates an embodiment wherein the diode cell contains a zener diode near the surface of the epi layer.

Yet another embodiment is shown in FIG. 25A. Diode cell 180 contains an N+ diffusion 183 and a P+ diffusion 184 which are formed at the same times, respectively, as the N+ source 186 and P+ body contact region 187 in MOSFET cell 182. Metal contact layer 185 contacts only the P+ diffusion 184 in diode cell 180. Since N+ diffusion 183 is essentially at the drain potential, the junction between N+ diffusion 183 and P+ diffusion 184 creates a diode in parallel with the channel of MOSFET cell 182. The characteristics of the junction between N+ region 183 and P+ region 184 set the breakdown of the diode cell 180. Alternatively, as shown by the dashed line, a portion 188 of the P-body diffusion can be introduced into the diode cell 180 to help shape the electric field. In another alternative (not shown) the P+ region 184 could be held back from the N+ region 183 so that P-body portion 188 is sandwiched by the N+ region 183 and P+ region 184 to form a PIN diode in diode cell 180.

Figure 25B:
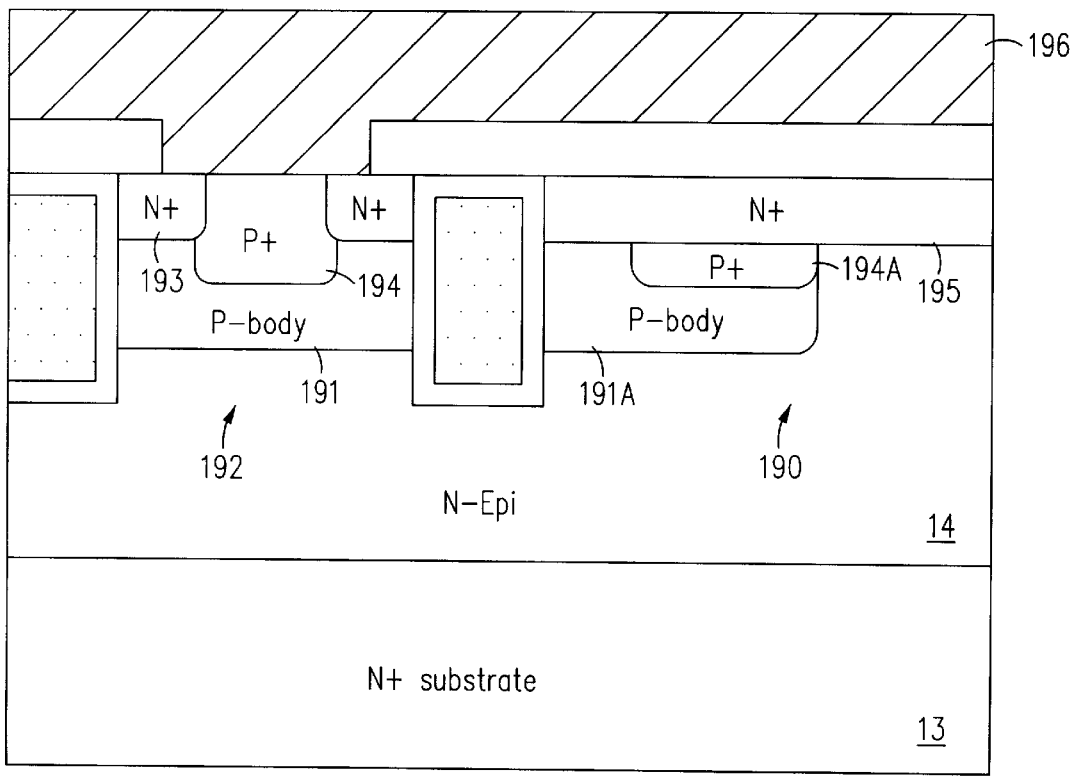
FIG. 25B illustrates an embodiment wherein the diode cell contains a buried zener diode.
Figure 25C:
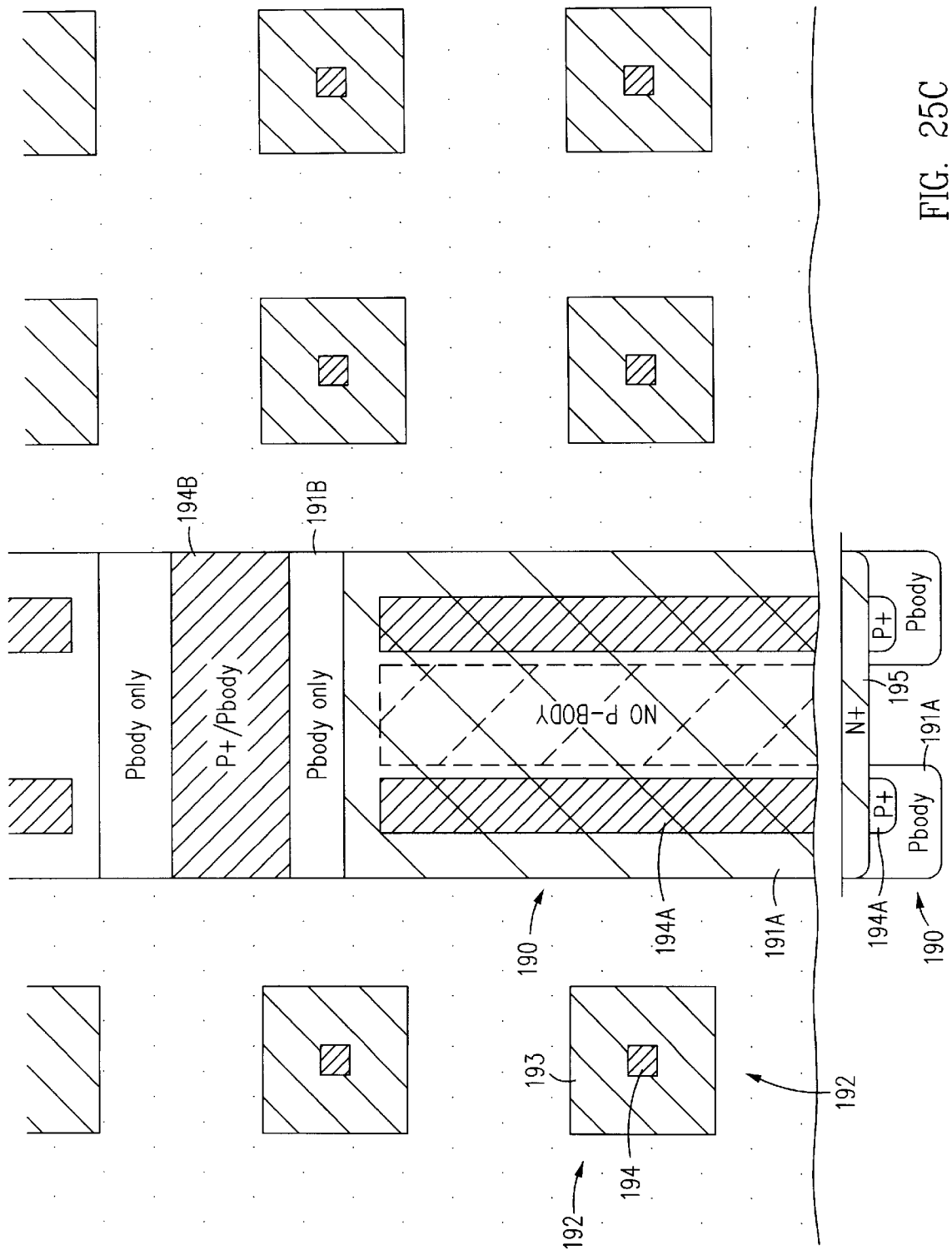
FIG. 25C illustrates a plan view of the embodiment shown in FIG. 25B.

In the embodiment of FIG. 25B, the dopant which forms the N+ source region 193 in MOSFET cell 192 is allowed to extend across the top surface of the epi layer 14 in diode cell 190, but the N+ source region 193 in MOSFET cell 192 is not electrically connected to the N+ region 195 in diode cell 190. The P-body region 191A and P+ body contact region 194A lie beneath the N+ region 195 in diode cell 190. Metal contact layer 196 does not make contact with diode cell 190. The plan view of FIG. 25C shows how the P-body region 191A and P+ region 194A are connected to a P-body region 191B and a P+ region 194B at a location in the third dimension away from the section shown in FIG. 25B. P+ region 194B extends upward to the surface and makes contact with metal layer 196 (not shown), thereby forming an electrical connection with P+ region 194 and P-body region 191 in MOSFET cell 192. Thus, in the embodiment of FIGS. 25B and 25C N+ region 195 within diode cell 190 is essentially at the drain potential, and breakdown occurs between N+ region 195 and P+ region 194, away from the sidewall of the trench.

In the embodiments of FIGS. 25A–25C impurity regions formed in the MOSFET cells (182 and 192, respectively) are used to form the regions which make up the diodes in diode cells (180 and 190, respectively). Thus additional implanting steps are not required. However, in some embodiments it will be necessary to employ separate implanting steps to form the regions of the diode cells. In FIG. 25A, a zener diode is formed between N+ region 183 and P+ region 184 at the surface of the N-epi layer 14. In FIG. 25B, a buried zener diode is formed in the diode cell 190. This may be advantageous because buried zener diodes tend to have more stable breakdown voltages than surface zener diodes. In both embodiments breakdown occurs away from the sidewall of the trench.

FIGS. 26A–26C, 27A–27D and 28 illustrate several of the numerous applications of a MOSFET according to this invention.

Figure 26A:
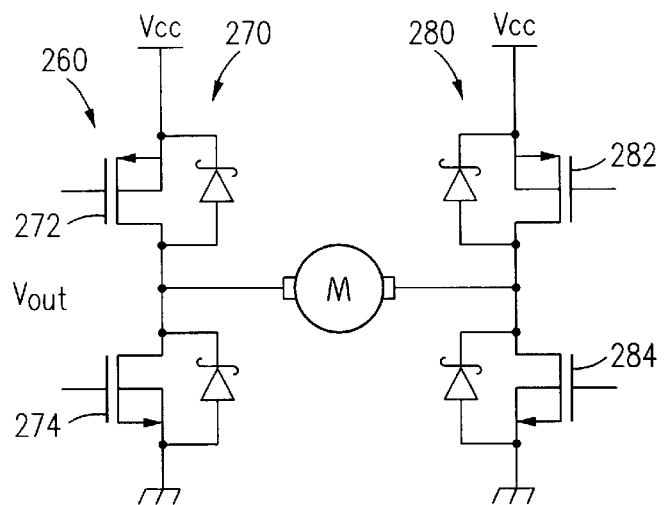
FIG. 26A illustrates a circuit diagram of a pulse width modulated (PWM) motor drive containing MOSFETs in accordance with this invention.

FIG. 26A shows a circuit diagram of a motor driver circuit 260 containing halfbridges 270 and 280 each connected between $V_{CC}$ and ground. Halfbridge 270 includes a high-side PMOS 272 and a low-side NMOS 274. Halfbridge 280 includes a high-side PMOS 282 and a low-side NMOS 284. The push-pull output voltage is delivered to motor M at the common junctions between the PMOS and NMOS transistors.

Each of halfbridges 270 and 280 has three states: a low state where the low-side NMOS is turned on and the high-side PMOS is turned off; a high state where the high-side PMOS is turned on and the low-side NMOS is turned off; and a third state in which both the high-side and low-side transistors are turned off and which occurs in the break-before-make (BBM) interval between the low and high states. The BBM interval is necessary to prevent a current shoot-through condition that would occur if the high-side and low-side transistors were turned on at the same time so as to short the $V_{CC}$ voltage supply rail to ground. During the BBM interval an inductive load such as the motor M drives $V_{out}$ to a level above the upper supply rail $V_{CC}$, and as a result the intrinsic PN diodes in the high-side transistors turn on. This condition continues until one of the transistors turns on.

Figure 26B:
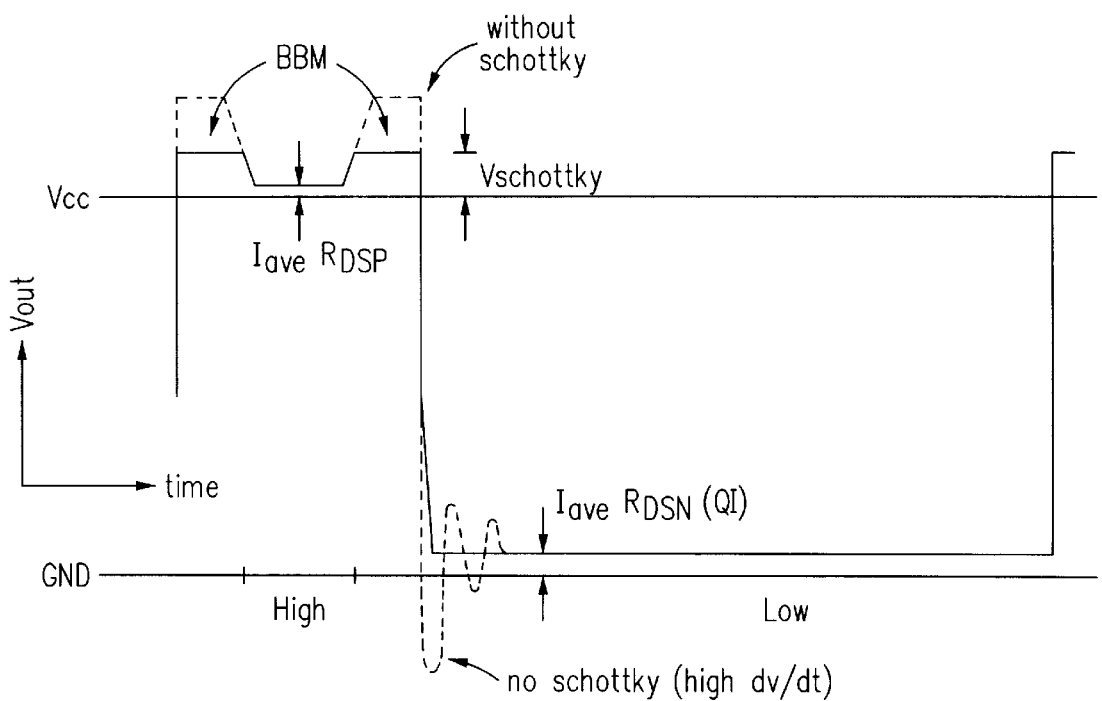
FIGS. 26B and 26C are graphs of the output voltage and diode current which illustrate the operation of the PWM motor drive of FIG. 26A
Figure 26C:
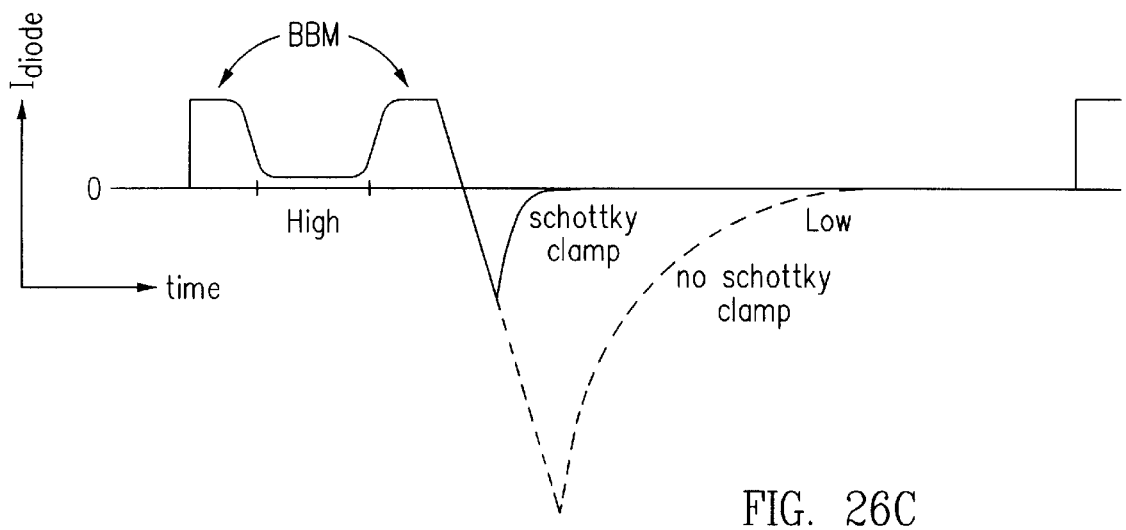

$V_{out}$ and the current through the diode in the high-side transistors ($I_{diode}$) are shown in FIGS. 26B and 26C, respectively. As indicated by the dashed lines, $V_{out}$ climbs well above $V_{CC}$ in a conventional MOSFET but this overshoot is limited when a Schottky diode is connected in parallel with the intrinsic PN diode in accordance with this invention. In the BBM interval which occurs in the transition from the high state to the low state $V_{out}$ falls very rapidly (high dV/dt) and there is a large current overshoot through the diode inside the high-side transistor. This leads to the generation of ringing and noise. When a Schottky diode is included in the high-side transistor, however, the voltage overshoot and dV/dt are reduced and the amount of noise generated is also reduced.

Figure 27A:
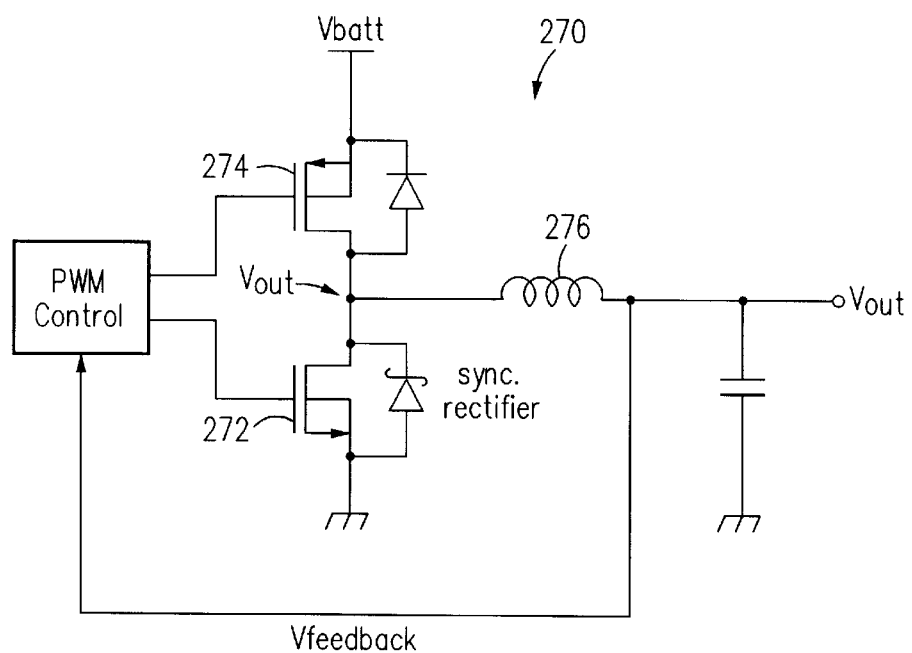
FIG. 27A illustrates a circuit diagram of a synchronous buck converter containing MOSFETs in accordance with this invention.

Similarly, in the synchronous buck converter 270 shown in FIG. 27A the low-side NMOS transistor 272 operates in Quadrant III as a synchronous rectifier whenever the high-side PMOS transistor 274 is not conducting, i.e., the inductor 276 forces the drain of transistor 272 below ground. By using the transistor 272 containing a Schottky diode as shown, the voltage drop across transistor 272 is reduced by almost one-half as compared with the voltage drop across a transistor which does not contain a Schottky clamp diode. As a result, noise is reduced during the switching transition, and the overall efficiency of the buck converter is improved.

Figure 27B:
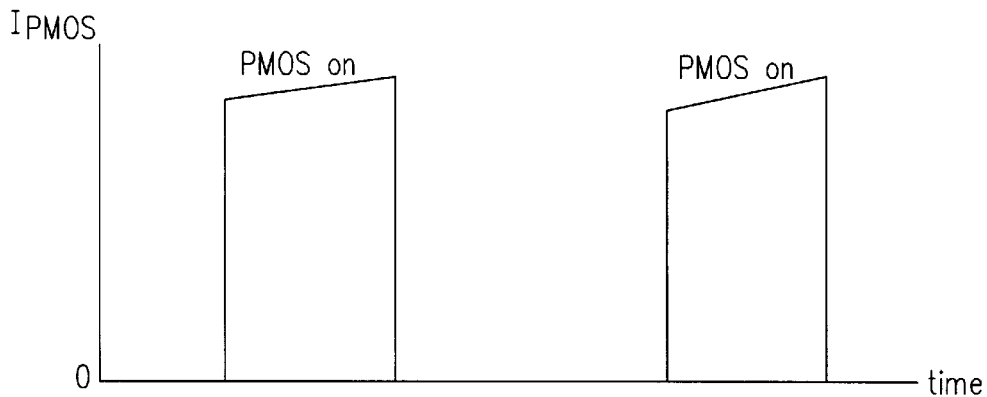
FIGS. 27B, 27C and 27D are graphs of the current through the NMOS and PMOS transistors and the output voltage which illustrate the operation of the synchronous buck converter of FIG. 27A.
Figure 27C:
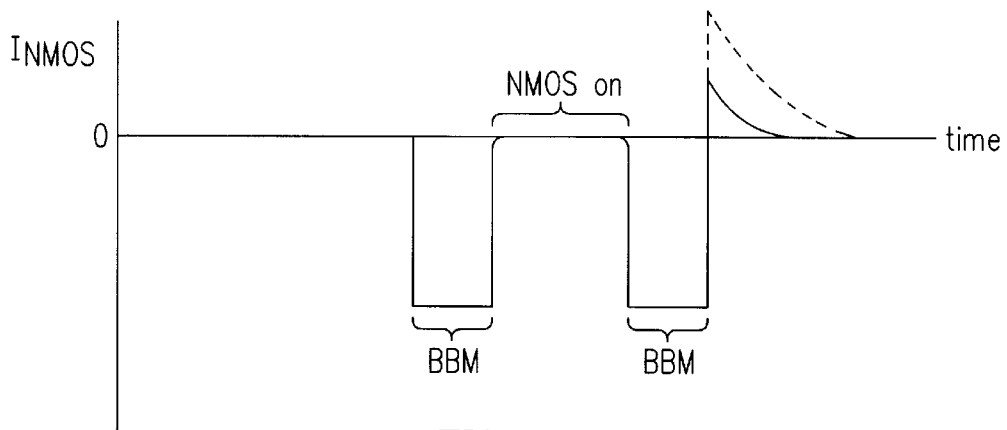
Figure 27D:
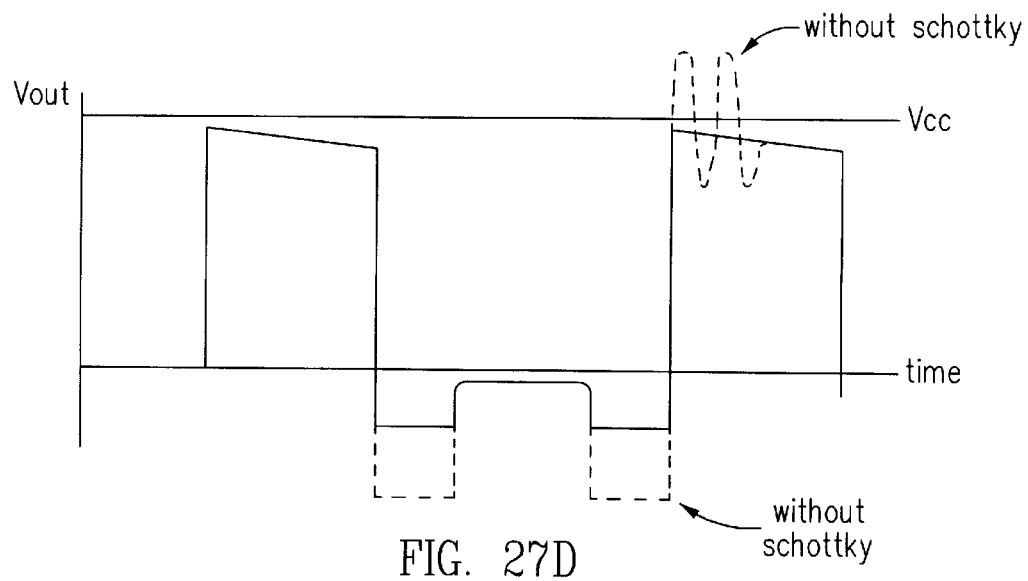
Figure 28:
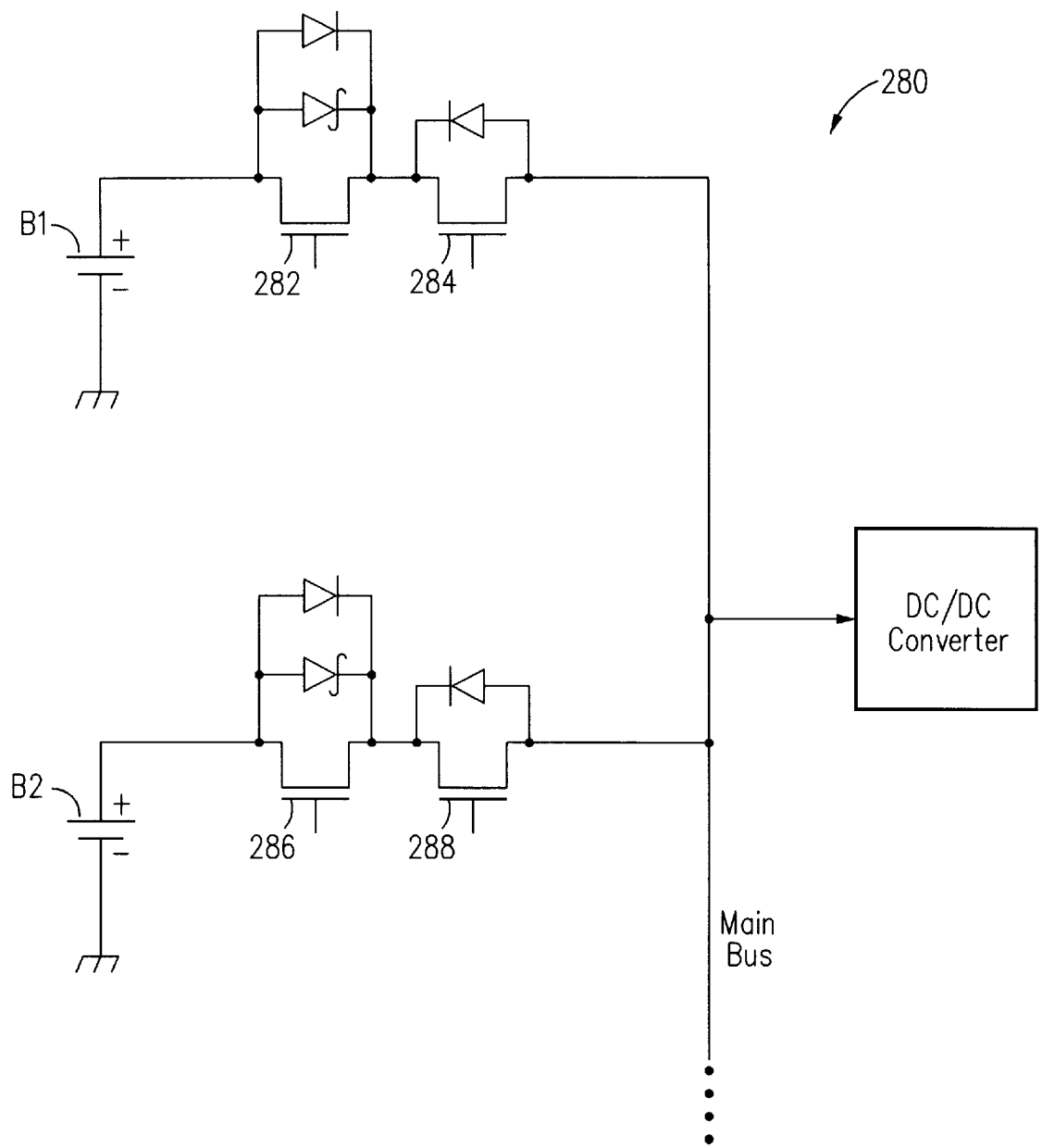
FIG. 28 illustrates a circuit diagram of a multiplexed battery supply circuit containing a pair of MOSFETs in accordance with this invention.

FIGS. 27B–27D illustrate how this occurs. FIG. 27B shows the current $I_{PMOS}$ through transistor 274, which rises rapidly when transistor is turned on. FIG. 27C shows the current $I_{NMOS}$ through transistor 272 which falls below zero (Quadrant III) in the BBM interval and overshoots when the PMOS transistor 274 is turned on. FIG. 27D shows $V_{out}$. The dashed lines in FIGS. 27C and 27D show the results if transistor 272 were replaced by a conventional NMOS transistor not containing a Schottky diode. The current overshoot is greater (FIG. 2C) and ringing occurs (FIG. 2D).

The impact of the reduced voltage drop across the Schottky diode and consequent reduction of power loss when the transistor is operating in Quadrant III is more pronounced in systems in which the Schottky diode must conduct for longer or even indefinite periods. One such arrangement is shown in the multiplexed battery supply circuit 280 of FIG. 28 where each of batteries B1 and B2 is connected to a main supply bus through a pair of back-to-back transistors. Thus transistors 282 and 284 form a battery disconnect switch (BDS) for battery B1 and transistors 286 and 288 form a BDS for battery B2. Transistors 282 and 286 contain a Schottky diode. In the normal full power mode both transistors within a BDS are turned on simultaneously to minimize the power loss in the BDS. During a fault condition, such as the removal of the battery that is used to power the system, only switches 284 and 288 are turned on and thus current does not flow through the channels of transistors 282 and 286. Including a Schottky diode in each of transistors 282 and 286 reduces the power loss in a fault condition until a specific MOSFET can be turned on.

The embodiments described above are illustrative only and not limiting. For example, it will be understood that all embodiments described can contain either P-channel or N-channel devices. Numerous other embodiments in accordance with the broad principles of this invention will be apparent to those skilled in the art.

We claim:

1. A trench-gated MOSFET comprising:
    a semiconductor chip;
    a trench extending from a top surface of said semiconductor chip, a wall of said trench being lined with a dielectric material, a gate being located within said trench;
    a source region of a first conductivity type located adjacent said top surface;
    a body region of a second conductivity type opposite to said first conductivity type located adjacent said source region and containing a channel region adjacent a wall of said trench;
    a drain region of said first conductivity type adjacent said body region;
    a first metal layer comprising a first metal in contact with said source region and said body region; and
    a Schottky diode comprising a second metal layer, said second metal layer comprising a second metal different from said first metal, said second metal layer being deposited on said semiconductor chip and forming a rectifying interface with said drain region, said second metal layer being electrically connected to said first metal layer;
    wherein said trench defines a plurality of cells, said source and body regions being located in a MOSFET cell and said Schottky diode being located in a Schottky cell, said plurality of cells further comprising a diode cell containing a diffusion of said second conductivity type extending from said top surface and forming a PN junction with said drain region, said diffusion being electrically connected to said first and second metal layers and to said source region.

2. The trench-gated MOSFET of claim 1 wherein said Schottky diode is connected in parallel with said channel region.

3. The trench-gated MOSFET of claim 1 wherein said first metal comprises aluminum and said second metal comprises a material from the group consisting of titanium, tungsten and platinum and the suicides of titanium, tungsten and platinum.

4. The trench-gated MOSFET of claim 1 wherein said first conductivity type is N and said second conductivity type is P.

5. A trench-gated MOSFET comprising a semiconductor chip;

a trench extending from a surface of said semiconductor chip, a wall of said trench being lined with a dielectric material, a gate being located within said trench;

a source region of a first conductivity type located adjacent said surface of said chip;

a body region of a second conductivity type opposite to said first conductivity type located adjacent said source region and containing a channel region adjacent a wall of said trench;

a drain region of said first conductivity type adjacent said body region; and a Schottky diode comprising a metal layer, said metal layer being deposited on said semiconductor chip and forming a rectifying interface with said semiconductor chip, said metal layer being electrically connected to said source region;

wherein said MOSFET comprises first, second and third cells defined by said trench, said source and body regions being contained in said first cell, said Schottky diode being located at said surface of said semiconductor chip in said second cell, said third cell comprising a diffusion of said second conductivity type extending from said top surface and forming a PN junction with said drain region, said PN junction extending between opposing walls of said trench and reaching a level below a bottom of said trench, said diffusion being electrically connected to said metal layer and to said source region.

6. The trench-gated MOSFET of claim 5 comprising a first plurality of cells similar to said first cell and a second plurality of cells similar to said second cell, said first plurality being greater than said second plurality.

7. The trench-gated MOSFET of claim 6 comprising a third plurality of cells similar to said third cell, said first plurality being greater than said third plurality.

8. The trench-gated MOSFET of claim 5 wherein said semiconductor chip comprises a substrate and an epitaxial layer formed on a surface of said substrate, said trench extending only into said epitaxial layer and not into said substrate, said epitaxial layer comprising first and second sublayers, said second sublayer being positioned above said first sublayer, said first sublayer having a concentration of dopant of said first conductivity type higher than the concentration of dopant of said first conductivity type in said second sublayer.

9. The trench-gated MOSFET of claim 8 wherein said trench extends only into said second sublayer.

10. The trench-gated MOSFET of claim 9 wherein said diffusion extends to an interface between said first and second sublayers.

11. The trench-gated MOSFET of claim 10 wherein said dopant concentration of said first sublayer is established such that a PN junction between said diffusion and said first sublayer has a breakdown voltage that is lower than a breakdown voltage of a PN junction between said body region and said second sublayer.

12. The trench-gated MOSFET of claim 6 wherein said semiconductor chip comprises a substrate and an epitaxial layer formed on a surface of said substrate, and said epitaxial layer comprises an implanted buried layer of said first conductivity type having a dopant concentration that is greater than a dopant concentration of a remaining portion of said epitaxial layer, said buried layer extending into said substrate, said trench extending into said implanted buried layer.

13. The trench-gated MOSFET of claim 1 comprising a plurality of said MOSFET cells, said Schottky cells and said diode cells, said Schottky cells being positioned at regular intervals in an array of said cells.

14. The trench-gated MOSFET of claim 1 comprising a plurality of said MOSFET cells, said Schottky cells and said diode cells, said diode cells being positioned at regular intervals in an array of said cells.

* * * * *

UNITED STATES PATENT AND TRADEMARK OFFICE
CERTIFICATE OF CORRECTION

PATENT NO. : 6,049,108
DATED : April 11, 2000
INVENTOR(S) : Richard K. Williams et al.

It is certified that error appears in the above-identified patent and that said Letters Patent is hereby corrected as shown below:

Column 14,
Line 63, please delete "AM" and insert -- µm --.

Column 20,
Line 66, please delete "suicides" and insert -- silicides --.

Signed and Sealed this

Twenty-third Day of July, 2002

Attest:

Attesting Officer

JAMES E. ROGAN
Director of the United States Patent and Trademark Office